United States Patent
Yamaguchi et al.

(10) Patent No.: US 12,550,628 B2
(45) Date of Patent: Feb. 10, 2026

(54) SUPERCONDUCTING DEVICE AND METHOD FOR MANUFACTURING THE SAME

(71) Applicant: NEC Corporation, Tokyo (JP)

(72) Inventors: Ayami Yamaguchi, Tokyo (JP); Kenji Nanba, Tokyo (JP)

(73) Assignee: NEC CORPORATION, Tokyo (JP)

( * ) Notice: Subject to any disclaimer, the term of this patent is extended or adjusted under 35 U.S.C. 154(b) by 731 days.

(21) Appl. No.: 17/984,363

(22) Filed: Nov. 10, 2022

(65) Prior Publication Data

US 2023/0165168 A1  May 25, 2023

(30) Foreign Application Priority Data

Nov. 25, 2021 (JP) .................................. 2021-190894

(51) Int. Cl.
*H10N 60/81* (2023.01)
*H10N 60/01* (2023.01)

(52) U.S. Cl.
CPC ............ *H10N 60/81* (2023.02); *H10N 60/01* (2023.02)

(58) Field of Classification Search
None
See application file for complete search history.

(56) References Cited

U.S. PATENT DOCUMENTS

| | | |
|---|---|---|
| 5,767,580 A | 6/1998 | Rostoker |
| 2020/0006621 A1* | 1/2020 | Mutus .................. H10N 60/815 |
| 2020/0119251 A1 | 4/2020 | Yohannes et al. |
| 2020/0220064 A1* | 7/2020 | Graninger ............. H10N 60/12 |
| 2020/0259064 A1 | 8/2020 | Lewandowski et al. |
| 2021/0408354 A1* | 12/2021 | Kikuchi .................. H01L 24/81 |

FOREIGN PATENT DOCUMENTS

| | | |
|---|---|---|
| JP | H05-251750 A | 9/1993 |
| JP | 2813093 B2 | 10/1998 |
| JP | 2008-027933 A | 2/2008 |
| WO | 2019/059879 A1 | 3/2019 |

OTHER PUBLICATIONS

JP Office Communication for JP Application No. 2021-190894, mailed on Dec. 23, 2025 with English Translation.

* cited by examiner

*Primary Examiner* — Hung K Vu
(74) *Attorney, Agent, or Firm* — Sughrue Mion, PLLC

(57) ABSTRACT

To provide a superconducting device capable of more accurately arranging a non-contact coupling circuit of a superconducting integrated circuit chip and a non-contact coupling circuit of a circuit board. The chip has a first electrode made of a first superconducting material and a first non-contact coupling circuit on a surface thereof. The board has a second electrode made of a second superconducting material and a second non-contact coupling circuit on a surface thereof, and is arranged to face the chip. The second electrode has a protrusion protruding toward the chip. The protrusion includes a flat upper surface. The first electrode has a flat surface and a first recess. The first recess is arranged to face the upper surface to be located inside the upper surface of the protrusion. A third superconducting material connecting the upper surface and the first recess.

20 Claims, 19 Drawing Sheets

SUPERCONDUCTING DEVICE AND METHOD FOR MANUFACTURING THE SAME

This application is based upon and claims the benefit of priority from Japanese Patent Application No. 2021-190894, filed on Nov. 25, 2021, the disclosure of which is incorporated herein in its entirety by reference.

TECHNICAL FIELD

The present invention relates to a superconducting device and the like.

BACKGROUND ART

In order to integrate a superconducting circuit, a structure in which a superconducting circuit integrated chip on which an integrated circuit is mounted is flip-chip mounted on a circuit board is known. In this structure, it is necessary to suppress reflection, interference, and the like of signals and to secure necessary signal quality (transmission characteristics). Therefore, non-contact coupling by capacitive coupling (capacitive coupling) or inductive coupling (inductive coupling) capable of reducing wiring routing in an integrated circuit is promising.

As a specific structure, a required number of non-contact coupling circuits are arranged in a superconducting integrated circuit chip. As the non-contact coupling circuit, for example, a capacitive coupling circuit or an inductive coupling circuit for inputting and outputting signals is used. The non-contact coupling circuit on the superconducting integrated circuit chip side and the non-contact coupling circuit on the circuit board side may be arranged to face each other. For the two non-contact coupling circuits to form a good non-contact coupling, a technique for coupling the superconducting integrated circuit chip and the circuit board while keeping the superconducting integrated circuit chip and the circuit board at a predetermined interval is required.

A technique related to the above requirement is disclosed in, for example, Patent Document 1 (Japanese Patent No. 2813093). In the technique of Patent Document 1, a second metal layer made of tin or tin and lead is laminated on a superconducting wire provided on a circuit board, and an electrode of the second metal layer and an electrode of a superconducting element are connected by solder. That is, first, a second metal layer having good solder wettability is formed on the superconducting wire, and then the electrode of the superconducting element and the electrode of the second metal layer are connected by solder. As a result, the electrode of the superconducting element and the superconducting wire of the electrode circuit board are connected via the second metal layer. Therefore, a highly reliable connection between the superconducting element and the circuit board can be obtained.

SUMMARY

However, in the structure disclosed in Patent Document 1, there is a problem that the distance between the non-contact coupling circuit of the superconducting integrated circuit chip and the non-contact coupling circuit of the circuit board cannot be accurately controlled. This is because there is a possibility that a mounting position of the non-contact coupling circuit of the superconducting integrated circuit chip or the non-contact coupling circuit of the circuit board is shifted while the molten solder is solidified.

The present invention has been made in view of the above problems, and an object thereof is to provide a superconducting device and the like capable of more accurately arranging a non-contact coupling circuit of a superconducting integrated circuit chip and a non-contact coupling circuit of a circuit board with respect to a design value.

In order to solve the above problems, according to an aspect of the present invention, there is provided a superconducting device including: a superconducting integrated circuit chip having a first electrode made of a first superconducting material and a first non-contact coupling circuit on a surface thereof; and a circuit board having a second electrode made of a second superconducting material and a second non-contact coupling circuit on a surface thereof, the circuit board being arranged in such a way to face the superconducting integrated circuit chip, in which the second electrode has a protrusion having a flat upper surface and protruding toward the superconducting integrated circuit chip, the first electrode includes a flat surface and a first recess arranged inside the flat surface and having an area smaller than an area of the upper surface, the first recess is arranged to face the upper surface in such a way to be located inside the upper surface, the upper surface and the flat surface are in contact with each other, and a third superconducting material connecting the upper surface and the first recess is arranged inside the first recess.

According to another aspect of the present invention, there is provided a method for manufacturing a superconducting device including a superconducting integrated circuit chip having a first electrode made of a first superconducting material and a first non-contact coupling circuit on a surface thereof, and a circuit board having a second electrode made of a second superconducting material and a second non-contact coupling circuit on a surface thereof, the circuit board being arranged in such a way to face the superconducting integrated circuit chip, the second electrode having a protrusion having a flat upper surface and protruding toward the superconducting integrated circuit chip, the first electrode including a flat surface and a first recess arranged inside the flat surface and having an area smaller than an area of the upper surface, the method including: arranging a third superconducting material connecting the upper surface and the first recess inside the first recess; arranging the first recess in such a way that the first recess faces the upper surface to be located inside the upper surface; and bringing the upper surface and the flat surface into contact with each other.

BRIEF DESCRIPTION OF THE DRAWINGS

Exemplary features and advantages of the present invention will become apparent from the following detailed description when taken with the accompanying drawings in which.

EXAMPLE EMBODIMENT

Figure 1:
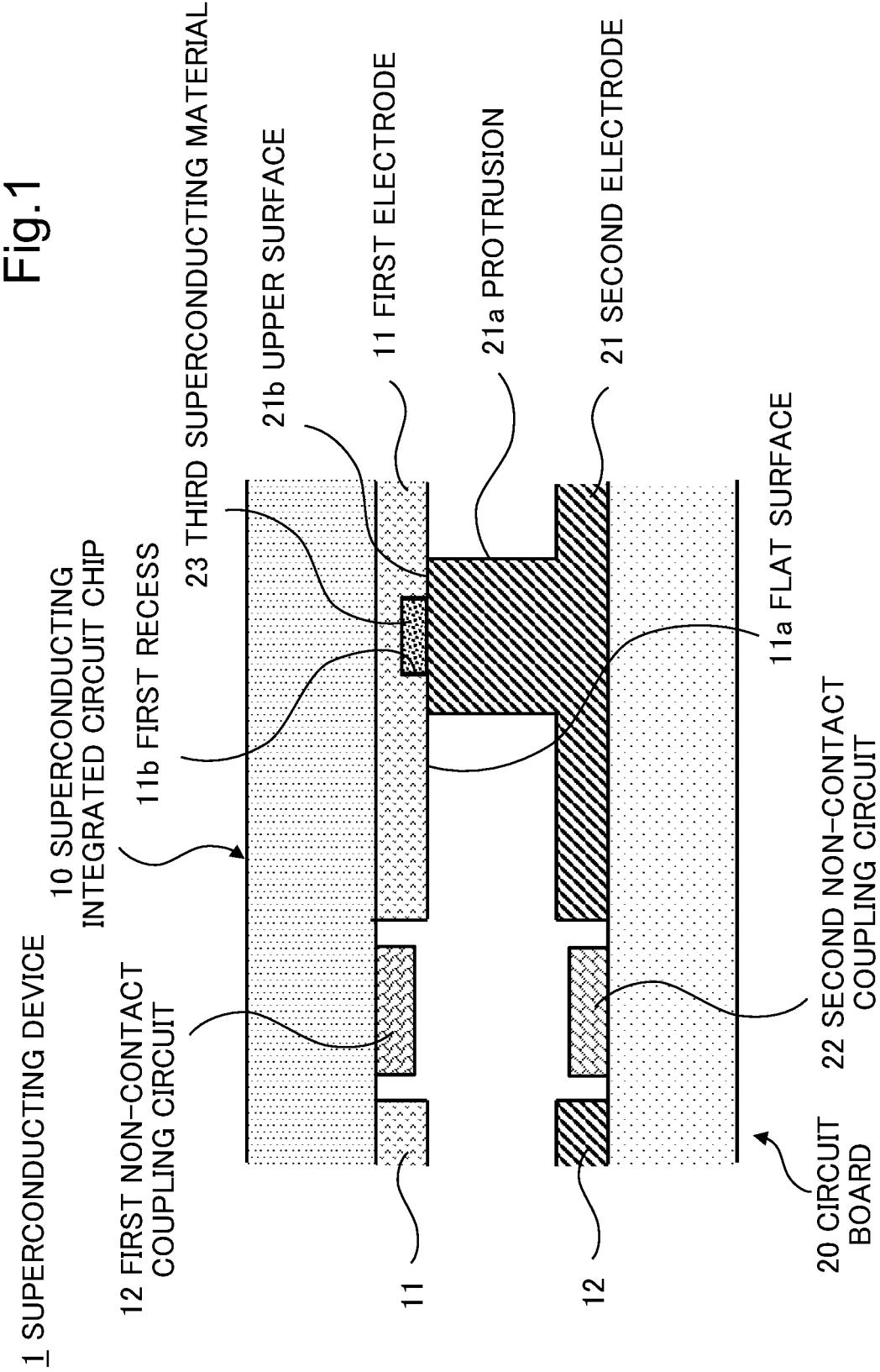
FIG. 1 is a cross-sectional view illustrating a configuration of a superconducting device according to a first example embodiment.

Hereinafter, example embodiments of the present invention will be described in detail with reference to the drawings. However, the example embodiments described below have technically preferable limitations for carrying out the present invention, but the scope of the invention is not limited to the following. Similar components in the drawings are denoted by the same reference numerals, and description thereof may be omitted.

First Example Embodiment

FIG. 1 is a cross-sectional view illustrating a superconducting device 1 of the present example embodiment. The superconducting device 1 includes a superconducting integrated circuit chip 10 and a circuit board 20. The superconducting integrated circuit chip 10 has a first electrode 11 made of a first superconducting material and a first non-contact coupling circuit 12 on a surface thereof. The circuit board 20 has a second electrode 21 made of a second superconducting material and a second non-contact coupling circuit 22 on the surface, and is arranged so as to face the superconducting integrated circuit chip 10. Here, the superconducting material refers to a substance that exhibits superconducting at a so-called cryogenic temperature close to absolute zero degree (273.15 degree Celsius below zero and can also be denoted as 0K). The material to be superconductive is roughly divided into a metal system having a relatively low temperature with a critical temperature (upper limit temperature at which the material exhibits a superconducting state) of up to about 40 K and an oxide system having a relatively high temperature around 100 K. As the metal system, for example, mercury, vanadium, lead, niobium, niobium-titanium, niobium-tin, niobium-aluminum, vanadium-gallium, magnesium-boron, or the like is used. As the oxide system, for example, oxides such as yttrium-barium-copper-oxygen and bismuth-lead-strontium-calcium-copper-oxygen are used.

The circuit board 20 has a second electrode 21 made of a second superconducting material and a second non-contact coupling circuit 22 on a surface thereof. The second electrode 21 includes a flat upper surface 21b and has a protrusion 21a protruding toward the superconducting integrated circuit chip 10.

The superconducting integrated circuit chip 10 has the first electrode 11 made of the first superconducting material and the first non-contact coupling circuit 12 on the surface thereof. The first electrode 11 includes a flat surface 11a and a first recess 11b that is arranged inside the flat surface 11a and has a smaller area than the upper surface 21b. The first recess 11b is arranged to face the upper surface 21b so as to be located inside upper surface 21b. The upper surface 21b and the flat surface 11a are in contact with each other. A third superconducting material 23 connecting the upper surface 21b and the first recess 11b is arranged inside the first recess 11b.

With this configuration, the first non-contact coupling circuit 12 and the second non-contact coupling circuit 22 are arranged to face each other. The positioning of the upper surface 21b and the first recess 11b and the positioning of the first non-contact coupling circuit 12 and the second non-contact coupling circuit 22 are designed to be performed simultaneously in a direction parallel to a main surface of the circuit board 20.

In the above configuration, since the upper surface 21b of the protrusion 21a is in contact with the flat surface 11a of the first electrode 11, the distance between the first non-contact coupling circuit 12 and the second non-contact coupling circuit 22 is determined to a predetermined value determined by a height of the protrusion 21a. That is, it is possible to provide the superconducting device 1 in which the first non-contact coupling circuit 12 and the second non-contact coupling circuit 22 are arranged more accurately with respect to a design value. As a result, it is possible to obtain input/output characteristics closer to a design value by non-contact coupling. The design value is a value including a predetermined tolerance with respect to a reference value. Since the first electrode 11 and the third superconducting material 23 are joined to each other in the first recess 11b, an area of a joint surface increases as compared with a case of joining flat surfaces to each other, and a strong joint can be formed.

The superconducting device 1 of the first example embodiment has been described above.

The superconducting device 1 of the first example embodiment includes the superconducting integrated circuit chip 10 and the circuit board 20. The superconducting integrated circuit chip 10 has the first electrode 11 made of the first superconducting material and the first non-contact coupling circuit 12 on the surface thereof. The circuit board 20 has the second electrode 21 made of the second superconducting material and the second non-contact coupling circuit 22 on the surface thereof, and is arranged so as to face the superconducting integrated circuit chip 10. The circuit board 20 has the second electrode 21 made of the second superconducting material and the second non-contact coupling circuit 22 on the surface thereof. The second electrode 21 includes the flat upper surface 21b and has the protrusion 21a protruding toward the superconducting integrated circuit chip 10. The superconducting integrated circuit chip 10 has the first electrode 11 made of the first superconducting material and the first non-contact coupling circuit 12 on the surface thereof. The first electrode 11 includes the flat surface 11a and the first recess 11b that is arranged inside the flat surface 11a and has an area smaller than that of the upper surface 21b. The first recess 11b is arranged to face the upper surface 21b to be located inside the upper surface 21b. The upper surface 21b and the flat surface 11a are in contact with each other. The third superconducting material 23 connecting the upper surface 21b and the first recess 11b is arranged inside the first recess 11b.

In the above configuration, since the upper surface 21b of the protrusion 21a is in contact with the flat surface 11a of the first electrode 11, the distance between the first non-contact coupling circuit 12 and the second non-contact coupling circuit 22 is determined to a predetermined value determined by the height of the protrusion 21a. That is, it is possible to provide the superconducting device 1 in which the first non-contact coupling circuit 12 and the second non-contact coupling circuit 22 are arranged more accurately with respect to a design value. As a result, it is possible to obtain input/output characteristics closer to a design value by non-contact coupling. The design value is a value including a predetermined tolerance with respect to a reference value. Since the first electrode 11 and the third superconducting material 23 are joined to each other in the first recess 11b, an area of a joint surface increases as compared with a case of joining flat surfaces to each other, and a strong joint can be formed.

Second Example Embodiment

In the present example embodiment, a superconducting device 1000 which is a specific configuration example of the superconducting device 1 of the first example embodiment will be described.

Figure 2:
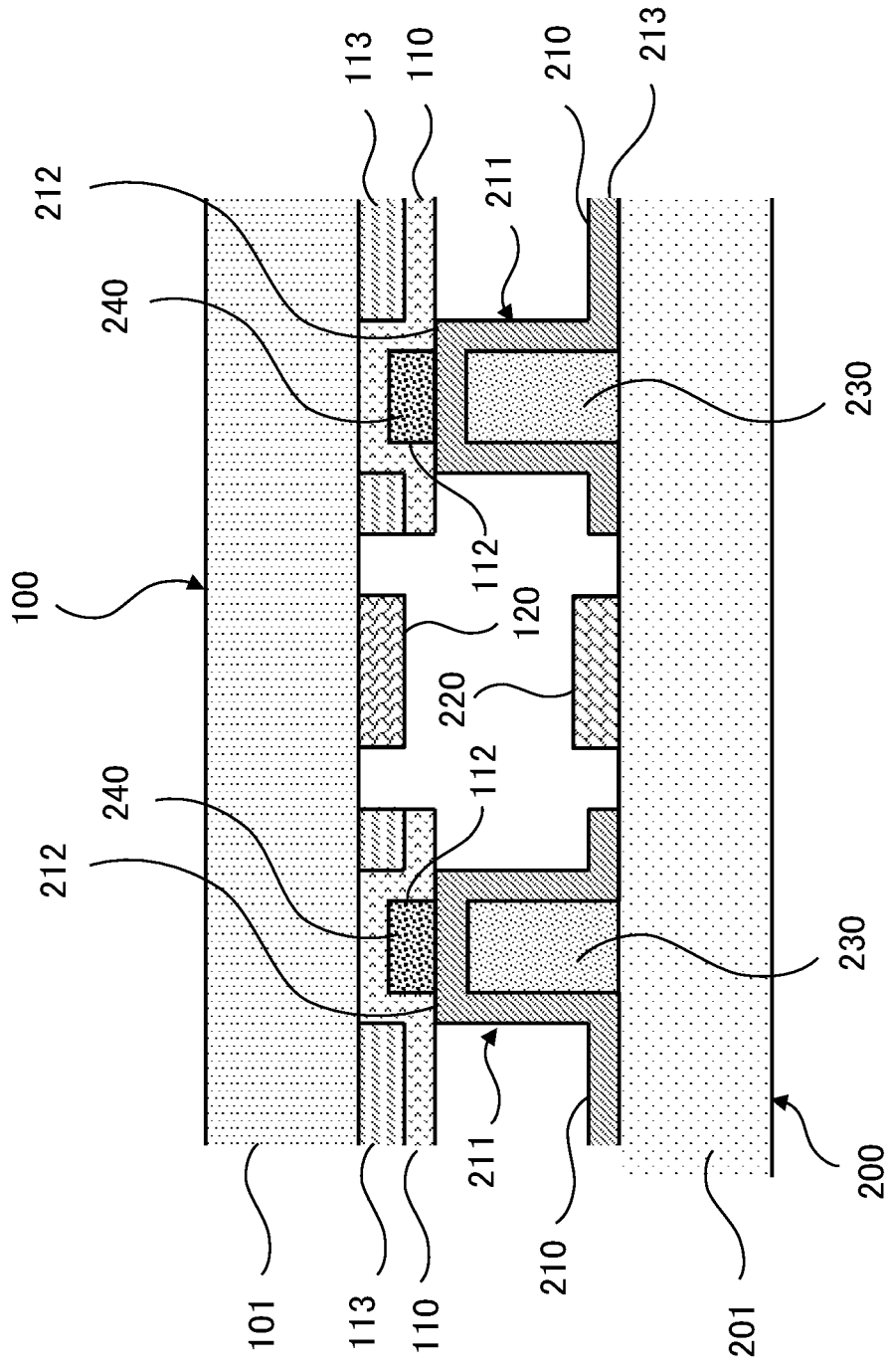
FIG. 2 is a cross-sectional view illustrating a configuration of a superconducting device of a second example embodiment.

FIG. 2 is a cross-sectional view illustrating a configuration of the superconducting device 1000 of the second example embodiment. The superconducting device 1000 is an example of the superconducting device 1.

Referring to FIG. 2, the superconducting device 1000 includes a superconducting integrated circuit chip 100 and a circuit board 200. The superconducting integrated circuit chip 100 has a first electrode 110 made of a first superconducting material and a first non-contact coupling circuit 120 on a surface thereof. The circuit board 200 has a second electrode 210 made of a second superconducting material and a second non-contact coupling circuit 220 on a surface thereof. The circuit board 200 is arranged so as to face the superconducting integrated circuit chip 100. The second electrode 210 includes a flat upper surface 212 and has a protrusion 211 protruding toward the superconducting integrated circuit chip 10. The first electrode 110 includes a flat surface 111 and a first recess 112 arranged inside the flat surface 111 and having an area smaller than that of the upper surface 212. The first recess 112 is arranged to face the upper surface 212 so as to be located inside the upper surface 212. The upper surface 212 and the flat surface 111 are in contact with each other. A third superconducting material 240 connecting the upper surface 212 and the first recess 112 is arranged inside the first recess 112.

Figure 3:
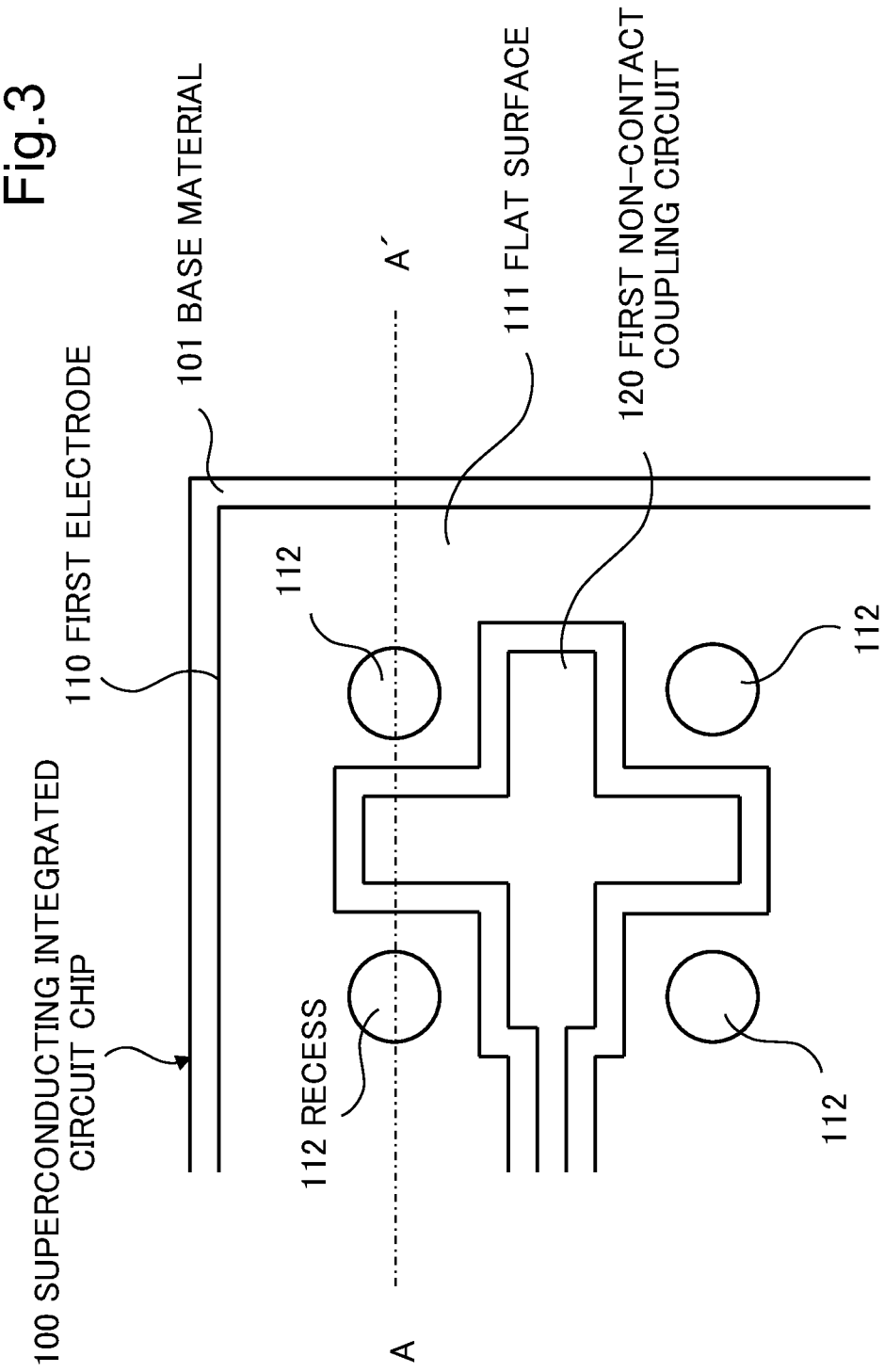
FIG. 3 is a plan view illustrating a configuration example of a superconducting integrated circuit chip used in the superconducting device of the second example embodiment.
Figure 4:
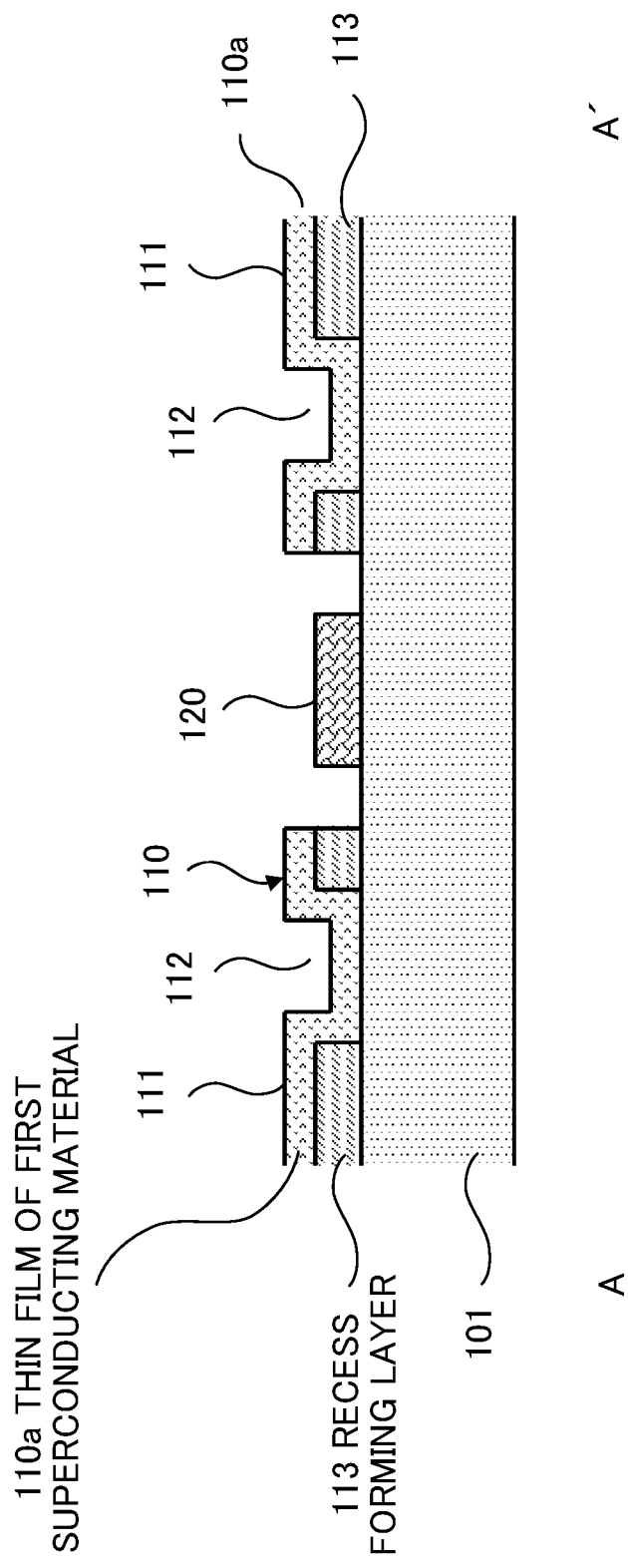
FIG. 4 is a cross-sectional view illustrating a first configuration example of the superconducting integrated circuit chip used in the superconducting device of the second example embodiment.

Next, a configuration example of the superconducting integrated circuit chip 100 used in the superconducting device 1000 of the second example embodiment will be described. FIG. 3 is a plan view illustrating a configuration example of the superconducting integrated circuit chip 100 used in the superconducting device 1000 of the second example embodiment. FIG. 4 is a cross-sectional view illustrating a first configuration example of the superconducting integrated circuit chip 100 used in the superconducting device 1000 of the second example embodiment. FIG. 4 is a cross-sectional view taken along line A-A' of FIG. 3.

Referring to FIGS. 3 and 4, the superconducting integrated circuit chip 100 has a base material 101. The first electrode 110 made of the first superconducting material and the first non-contact coupling circuit 120 are formed on the surface of the base material 101. The first electrode 110 has the flat surface 111 and the first recess 112 provided inside the flat surface. The superconducting integrated circuit chip 100 is an example of the superconducting integrated circuit chip 10 of the first example embodiment. The first electrode 110 is an example of the first electrode 11 of the first example embodiment, the first non-contact coupling circuit 120 is an example of the first non-contact coupling circuit 12, the flat surface 111 is an example of the flat surface 11a, and the first recess 112 is an example of the first recess 11b.

The first electrode 110 is connected to, for example, a circuit such as a ground circuit (not illustrated). The first non-contact coupling circuit 120 is connected to, for example, a superconducting circuit (not illustrated). As the first superconducting material constituting the first electrode 110, for example, niobium, niobium nitride, aluminum, indium, lead, tin, rhenium, palladium, titanium, titanium nitride, tantalum, or an alloy containing these materials can be used. For example, silicon can be used for the base material 101. The first non-contact coupling circuit 120 is, for example, a capacitive coupling circuit or an inductive coupling circuit for inputting and outputting signals to and from the circuit board 200. As the base material 101, for example, silicon can be used. Although not illustrated, a first wiring layer may be provided below the first electrode 110.

As illustrated in FIG. 4, a thin film 110a of the first superconducting material is arranged on the surface of the first electrode 110. The thin film 110a of the first superconducting material has, for example, a uniform film thickness. A recess forming layer 113 is arranged below the thin film 110a of the first superconducting material. The recess forming layer 113 is patterned, and the patterned thin film 110a of the first superconducting material is laminated thereon to form the flat surface 111 and the first recess 112. The recess forming layer 113 can be formed using, for example, a wiring layer of a superconducting integrated circuit chip.

Next, as a modification of the superconducting integrated circuit chip 100 used in the superconducting device 1000 of the second example embodiment, a second configuration example of the superconducting integrated circuit chip 100 will be described.

Figure 5:
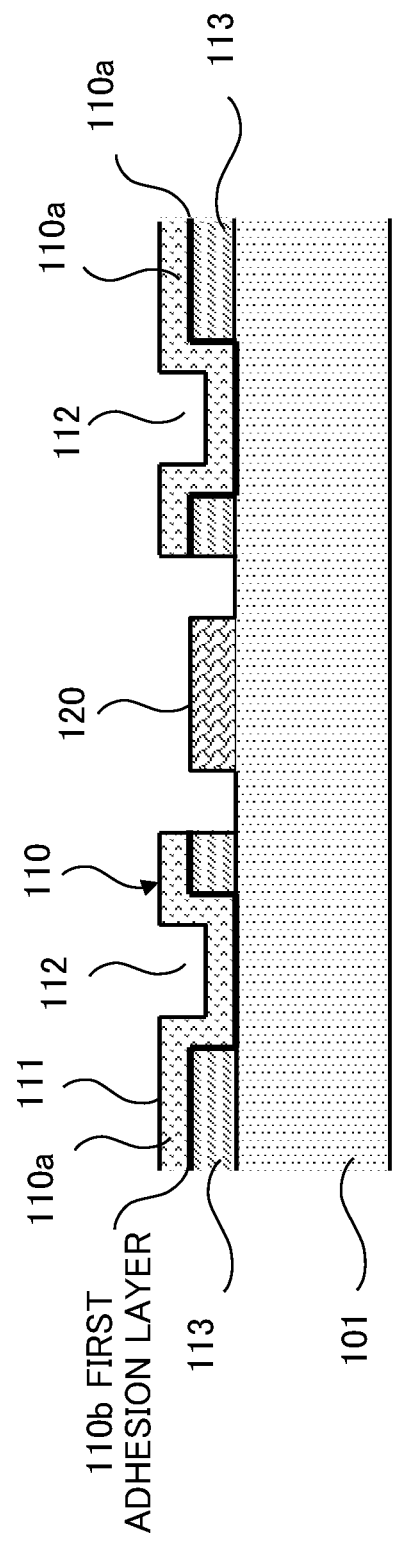
FIG. 5 is a cross-sectional view illustrating a second configuration example of the superconducting integrated circuit chip used in the superconducting device of the second example embodiment.

FIG. 5 is a cross-sectional view illustrating the second configuration example of the superconducting integrated circuit chip 100 used in the superconducting device 1000 of the second example embodiment. In the second configuration illustrated in FIG. 5, in addition to the configuration of FIG. 4, a first adhesion layer 110b is arranged below the thin film 110a of the first superconducting material. By providing the first adhesion layer 110b, adhesion between the thin film 110a of the first superconducting material and the base material 101 and the recess forming layer 113 is improved. For the first adhesion layer 110b, for example, titanium, titanium nitride, iridium, or the like can be used.

Next, as a modification of the superconducting integrated circuit chip 100 used in the superconducting device 1000 of the second example embodiment, a third configuration example of the superconducting integrated circuit chip 100 will be described.

Figure 6:
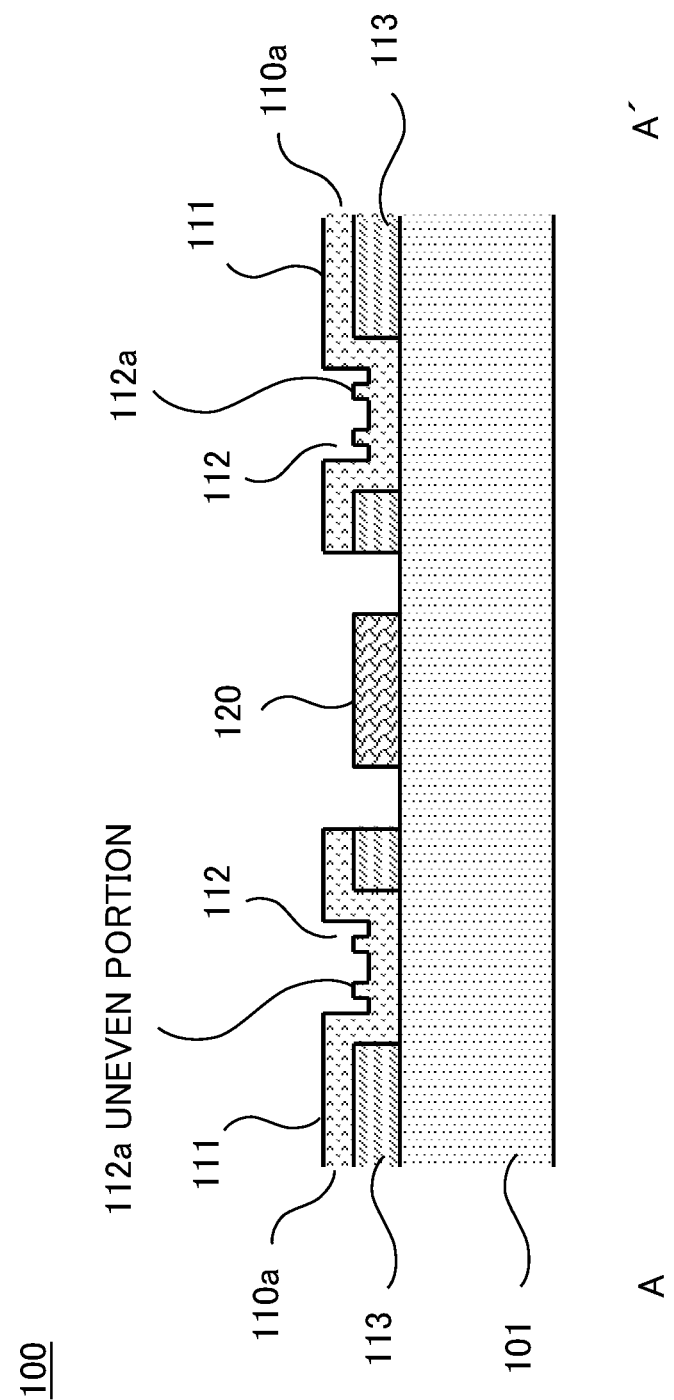
FIG. 6 is a cross-sectional view illustrating a third configuration example of the superconducting integrated circuit chip used in the superconducting device of the second example embodiment.

FIG. 6 is a cross-sectional view illustrating the third configuration example of the superconducting integrated circuit chip 100 used in the superconducting device 1000 of the second example embodiment. In the third configuration example, an uneven portion 112a is formed at a bottom portion of the first recess 112. Other configurations can be similar to the first configuration example of FIG. 4 or the second configuration example of FIG. 5. Since a surface area of the first recess 112 increases by providing the uneven portion 112a, when the first recess 112 is filled with a joining material, a joining force between the joining material and the thin film 110a of the first superconducting material in the first recess 112 can increase. The uneven portion 112a can be formed, for example, by roughening the bottom surface of the first recess 112 by physical etching or chemical etching, or by patterning the recess forming layer 113, but is not limited thereto.

Next, as a modification of the superconducting integrated circuit chip 100 used in the superconducting device 1000 of the second example embodiment, a fourth configuration example of the superconducting integrated circuit chip 100 will be described.

Figure 7:
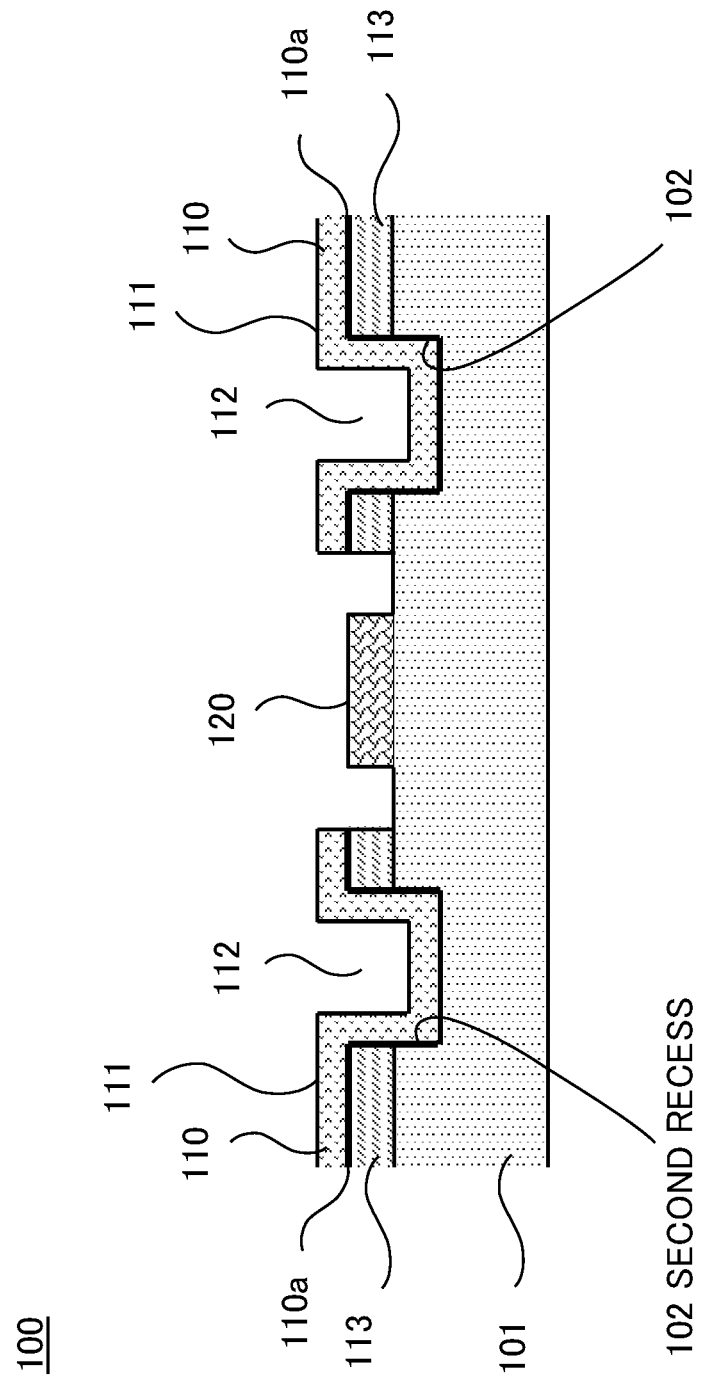
FIG. 7 is a cross-sectional view illustrating a fourth configuration example of the superconducting integrated circuit chip used in the superconducting device of the second example embodiment.

FIG. 7 is a cross-sectional view illustrating the fourth configuration example of the superconducting integrated circuit chip used in the superconducting device of the second example embodiment. As illustrated in FIG. 7, in the fourth configuration example, the second recess 102 is arranged below the first electrode 110 in the first recess 112. For example, as illustrated in FIG. 7, the second recess 102 can be formed by digging the base material 101. The base material 101 can be, for example, silicon, but various methods of performing three-dimensional processing with high accuracy have been developed for silicon, and these methods can be used to form the second recess 102 with high accuracy. In the above configuration, for example, it is easier to form the deep first recess 112 than the method of forming the first recess 112 using the recess forming layer 113 in the first configuration example. Since the surface area of the first recess 112 increases by making the first recess 112 deep, when the first recess 112 is filled with a joining material, the joining force between the joining material and the thin film 110a of the first superconducting material in the first recess 112 can increase.

Next, as a modification of the superconducting integrated circuit chip 100 used in the superconducting device 1000 of the second example embodiment, a fifth configuration example of the superconducting integrated circuit chip 100 will be described.

Figure 8:
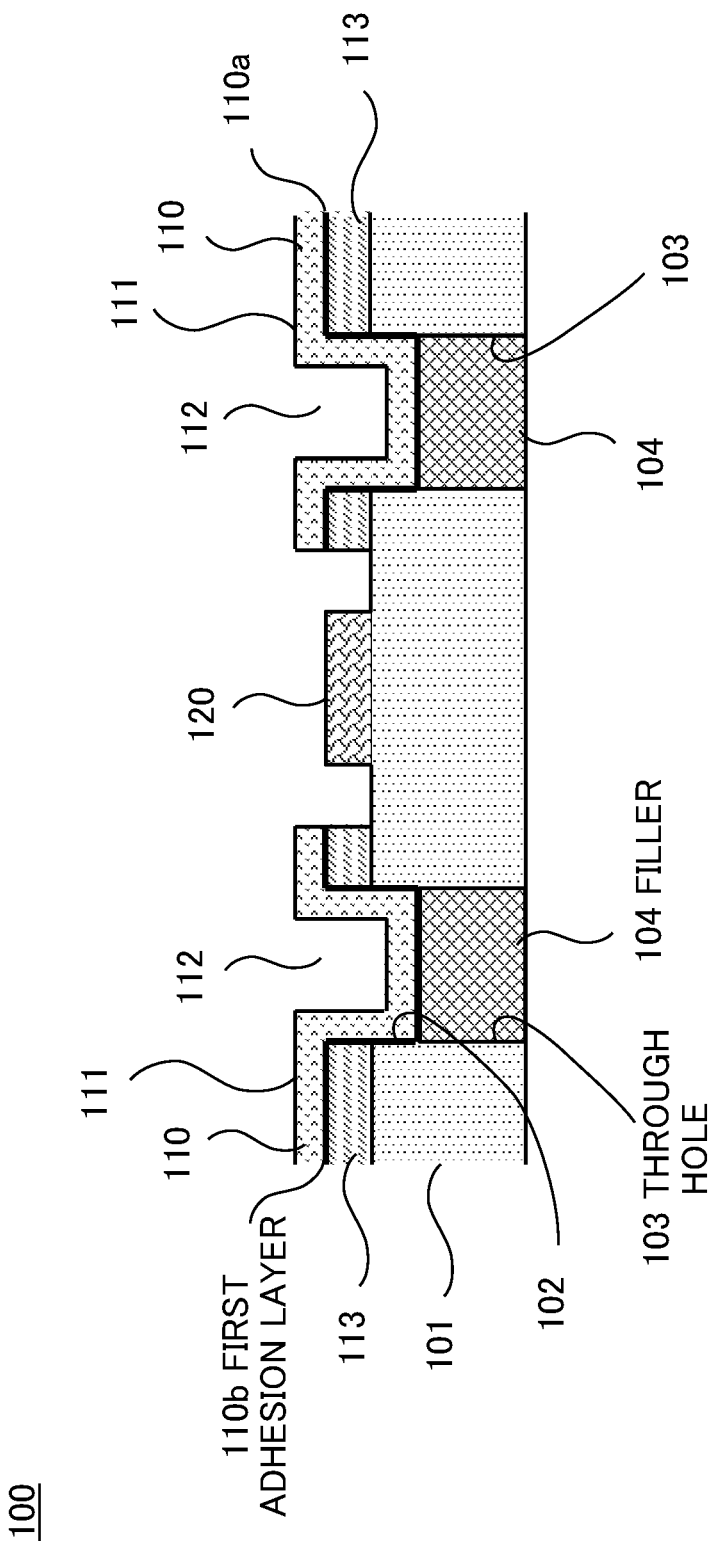
FIG. 8 is a cross-sectional view illustrating a fifth configuration example of the superconducting integrated circuit chip used in the superconducting device of the second example embodiment.

FIG. 8 is a cross-sectional view illustrating the fifth configuration example of the superconducting integrated circuit chip used in the superconducting device of the second example embodiment. In the fifth configuration example, a through hole 103 is formed in the base material 101 at a position corresponding to the first recess 112, and the through hole 103 is filled to a predetermined depth with a filler 104, thereby forming the second recess 102. In this way, it is easy to form the deep first recess 112. Therefore, similarly to the fourth configuration example, since the surface area of the first recess 112 increases, when the first recess 112 is filled with the joining material, the joining force between the joining material and the thin film 110a of the first superconducting material in the first recess 112 can be increased.

In the above description, an example in which the shape of the first recess 112 is a cylindrical shape has been described, but the shape of the first recess 112 is not limited thereto, and may be, for example, a polygonal prism, a cone, a polygonal cone, a truncated cone, a polygonal truncated cone, or the like.

Figure 9:
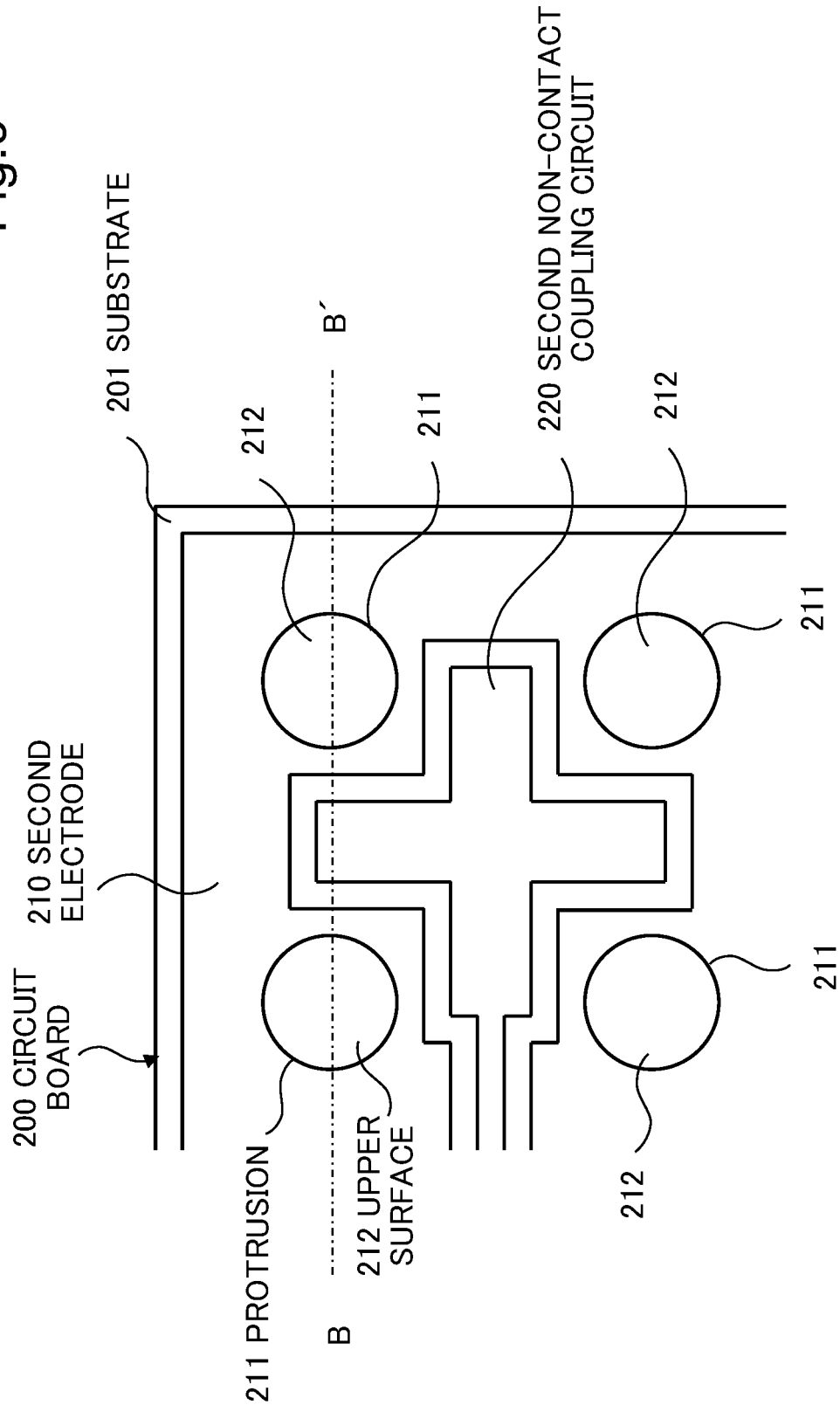
FIG. 9 is a plan view illustrating a circuit board used in the superconducting device according to the second example embodiment.
Figure 10:
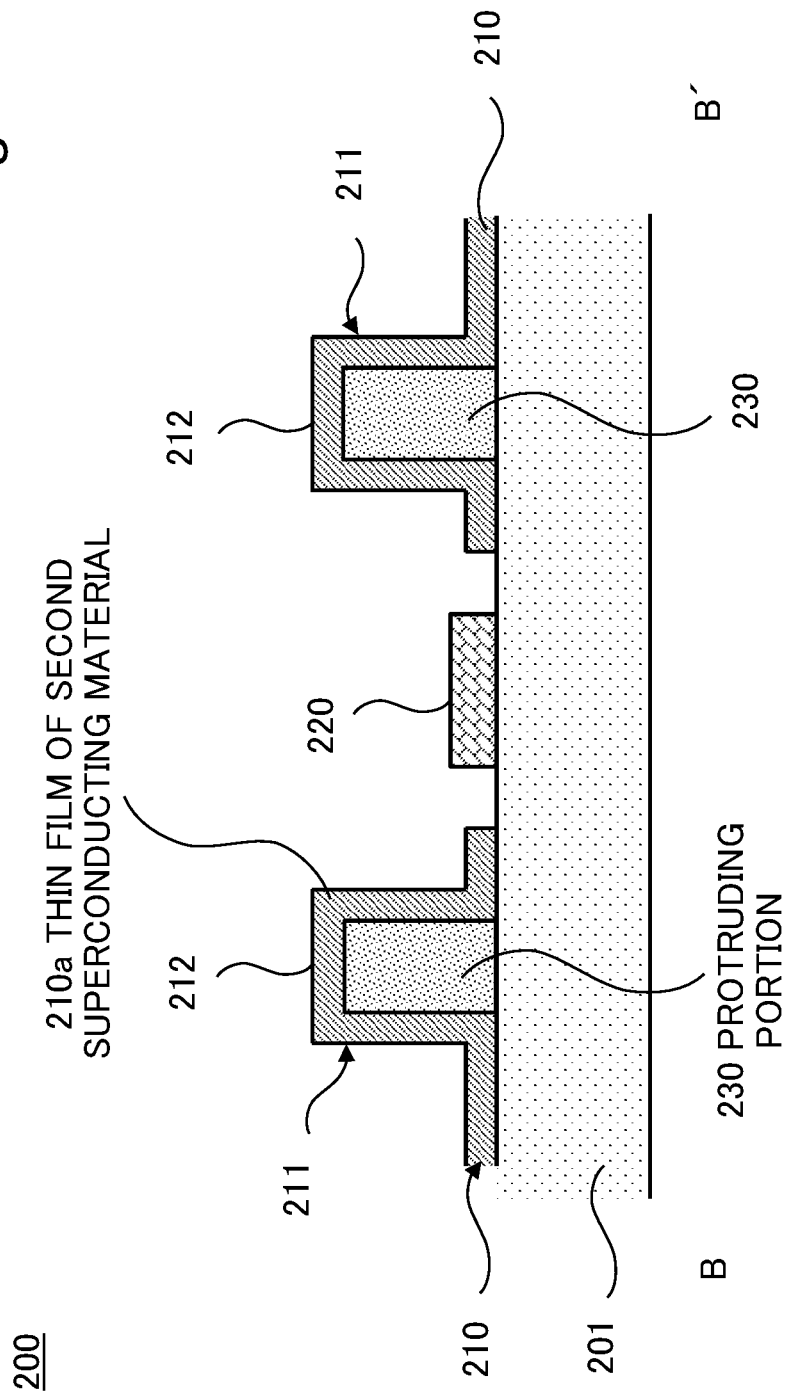
FIG. 10 is a cross-sectional view illustrating a first configuration example of the circuit board used in the superconducting device of the second example embodiment.
Figure 11:
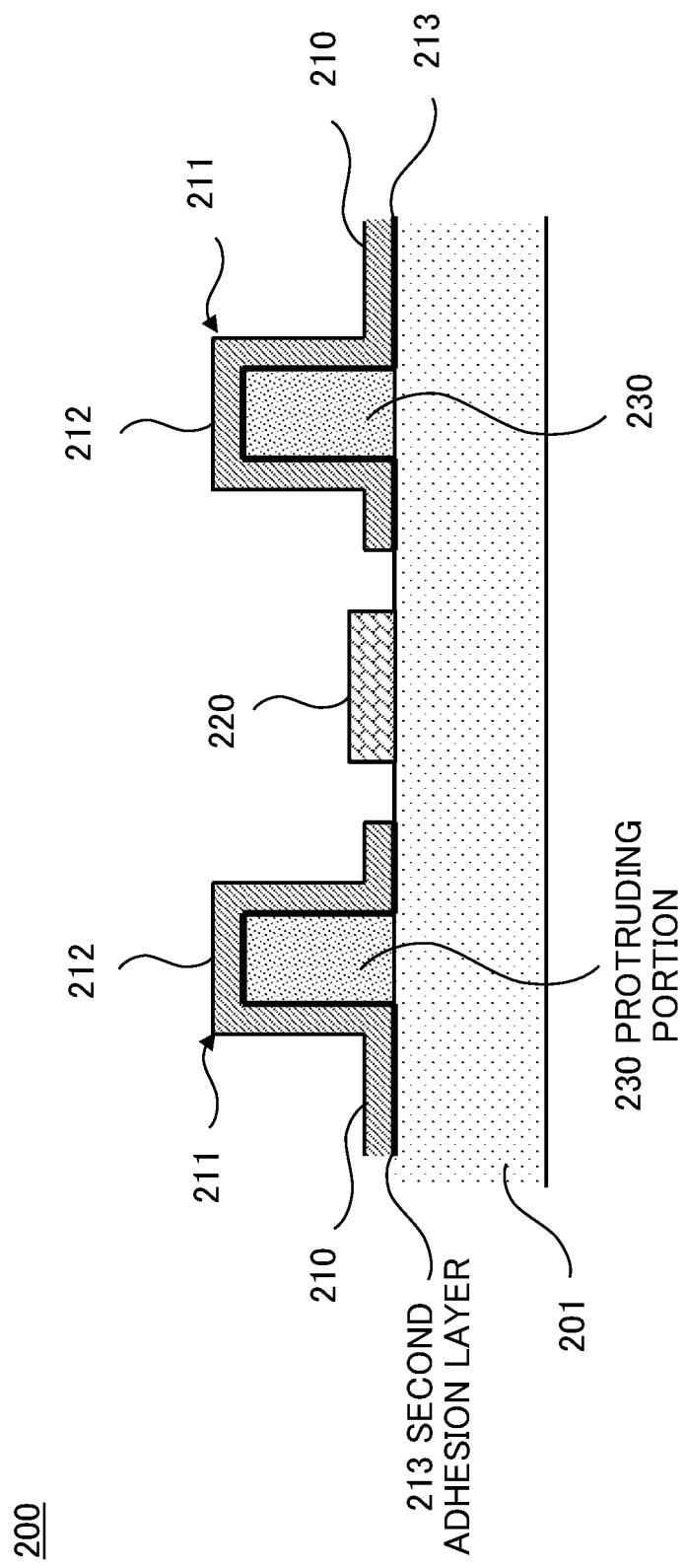
FIG. 11 is a cross-sectional view illustrating a second configuration example of the circuit board used in the superconducting device of the second example embodiment.

Next, a configuration of the circuit board 200 used in the superconducting device 1000 of the second example embodiment will be described. FIG. 9 is a plan view illustrating the circuit board 200 used in the superconducting device 1000 of the second example embodiment. FIG. 10 is a cross-sectional view illustrating a first configuration example of the circuit board 200 used in the superconducting device of the second example embodiment. FIG. 11 is a cross-sectional view illustrating a second configuration example of the circuit board 200 used in the superconducting device of the second example embodiment.

As illustrated in FIGS. 9 and 10, the circuit board 200 includes a substrate 201. A second electrode 210 made of a second superconducting material and a second non-contact coupling circuit 220 are formed on the surface of the substrate 201. The second electrode 210 has a protrusion 211 having a flat upper surface 212 and a predetermined height. Here, the circuit board 200 is an example of the circuit board 20 of the first example embodiment. The second electrode 210 is an example of the second electrode 21, the second non-contact coupling circuit 220 is an example of the second non-contact coupling circuit 22, the protrusion 211 is an example of the protrusion 21a, and the upper surface 212 is an example of the upper surface 21b.

The substrate 201 of the circuit board 200 is, for example, silicon. As the second superconducting material, for example, niobium, niobium nitride, aluminum, indium, lead, tin, rhenium, palladium, titanium, titanium nitride, tantalum, or an alloy containing these can be used. The second electrode 210 is connected to, for example, a ground circuit (not illustrated). The second non-contact coupling circuit 220 is connected to, for example, an electronic circuit (not illustrated). Although not illustrated, a second wiring layer may be provided below the second electrode 210.

FIG. 10 is a cross-sectional view illustrating the circuit board 200 used in the superconducting device of the second example embodiment. FIG. 10 is a cross-sectional view taken along line B-B' in FIG. 9. As illustrated in FIG. 10, a protruding portion 230 having a flat upper surface and a predetermined height is formed on the substrate 201. The second electrode 210 is formed by covering the protruding portion 230 with a thin film 210a of the second superconducting material. The thin film 210a of the second superconducting material has, for example, a uniform film thickness. The thin film 210a of the second superconducting material can be formed of, for example, niobium, niobium nitride, aluminum, lead, tin, rhenium, palladium, titanium, titanium nitride, tantalum, or an alloy containing these. The protruding portion 230 can be formed using a material different from the thin film 210a of the second superconducting material, for example, a metal such as copper, silver, gold, platinum, or an alloy containing these.

Some superconducting materials such as niobium have poor workability, and it is difficult to form a three-dimensional structure such as the protruding portion 230. Therefore, the protruding portion 230 can be easily formed by using a material that is easy to process. By using a material having good workability, the height of the protruding portion 230 can be accurately controlled, and the upper surface can be made flat. Then, by stacking the thin film 210a of the second superconducting material whose film thickness is accurately controlled on the protruding portion 230, the height of the protrusion 211 can be accurately controlled and the upper surface 212 can be made flat. The second electrode 210 and the protrusion 211 can be easily formed by performing processing such as photolithography and etching on the laminated film.

Next, as a modification of the circuit board 200 used in the superconducting device of the second example embodiment, a second configuration example of the circuit board 200 will be described.

FIG. 11 is a cross-sectional view illustrating the second configuration example of the circuit board 200 used in the superconducting device of the second example embodiment. In the second configuration example of the circuit board 200, in addition to the first configuration example of FIG. 10, a second adhesion layer 213 is laminated below the thin film 210a of the second superconducting material. By providing the second adhesion layer 213, adhesion between the thin film 210a of the second superconducting material and the substrate 201 and the protruding portion 230 is improved. For the second adhesion layer 213, for example, titanium, titanium nitride, iridium, or the like can be used.

Next, as a modification of the arrangement of a third superconducting material 240 on the circuit board 200 used in the superconducting device of the second example embodiment, a first example of the arrangement of the third superconducting material 240 on the circuit board 200 will be described.

Figure 12:
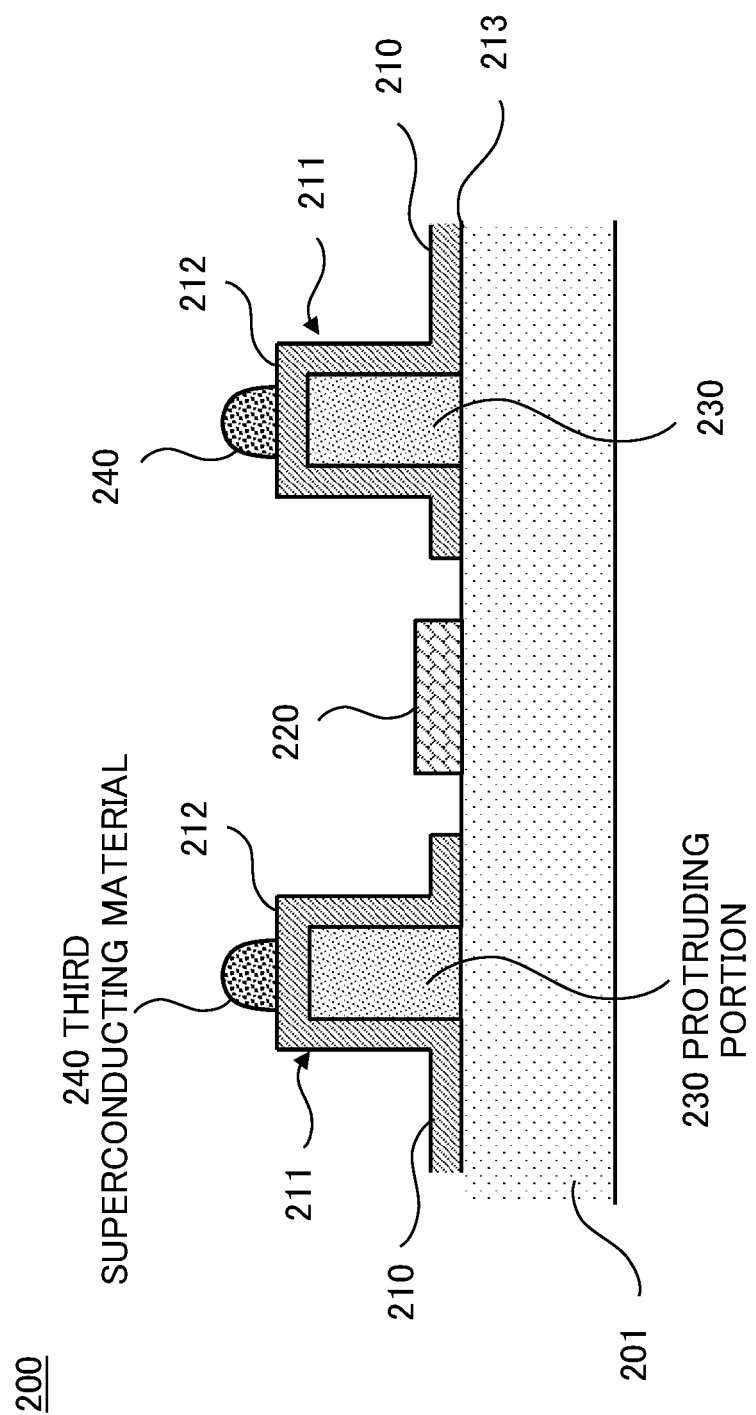
FIG. 12 is a cross-sectional view illustrating a first example of arrangement of a third superconducting material on the circuit board of the superconducting device of the second example embodiment.

FIG. 12 is a cross-sectional view illustrating the first example of arrangement of the third superconducting material 240 on the circuit board 200 of the superconducting device 1000 according to the second example embodiment. The third superconducting material 240 connects the upper surface 212 of the protrusion 211 and the first recess 112 of the superconducting integrated circuit chip 100. In the case of manufacturing the superconducting device 1000, a circuit formation surface of the superconducting integrated circuit chip 100 and a circuit formation surface of the circuit board 200 face each other and brought close to each other, and the upper surface 212 of the protrusion 211 and the flat surface 111 of the first electrode 110 are brought into contact with each other. In this case, alignment is performed such that the first recess 112 is accommodated inside the upper surface 212. Then, the third superconducting material 240 is joined to the thin film 110a of the first superconducting material of the first recess 112 and the thin film 210a of the second superconducting material of the upper surface 212.

In the above configuration, a volume of the third superconducting material 240 is desirably close to a volume of the first recess 112 so that the third superconducting material 240 is in contact with the entire inner surface of the first recess 112. Meanwhile, it is desirable that the third superconducting material 240 does not protrude from a contact portion between the upper surface 212 of the protrusion 211 and the flat surface 111 of the first electrode 110. Therefore, for example, the volume of the third superconducting material 240 can be set to a size smaller than the volume of the first recess 112 by a predetermined margin. After such setting, the third superconducting material 240 is arranged in a bump shape on the upper surface 212.

The third superconducting material 240 is crushed inside the first recess 112 to connect the thin film 110a of the first superconducting material and the thin film 210a of the second superconducting material. Therefore, as the third superconducting material 240, it is desirable to use a material having higher spreadability than the thin film 110a of the first superconducting material and the thin film 210a of the second superconducting material. To meet this condition, it is desirable to select the third superconducting material 240 according to the material used for the thin film 110a of the first superconducting material and the thin film 210a of the second superconducting material. For example, when both the thin film 110a of the first superconducting material and the thin film 210a of the second superconducting material are niobium, the third superconducting material 240 can be indium.

Next, as a modification of the arrangement of the third superconducting material on the circuit board 200 used in the superconducting device of the second example embodiment, a second example of the arrangement of the third superconducting material on the circuit board 200 will be described.

Figure 13:
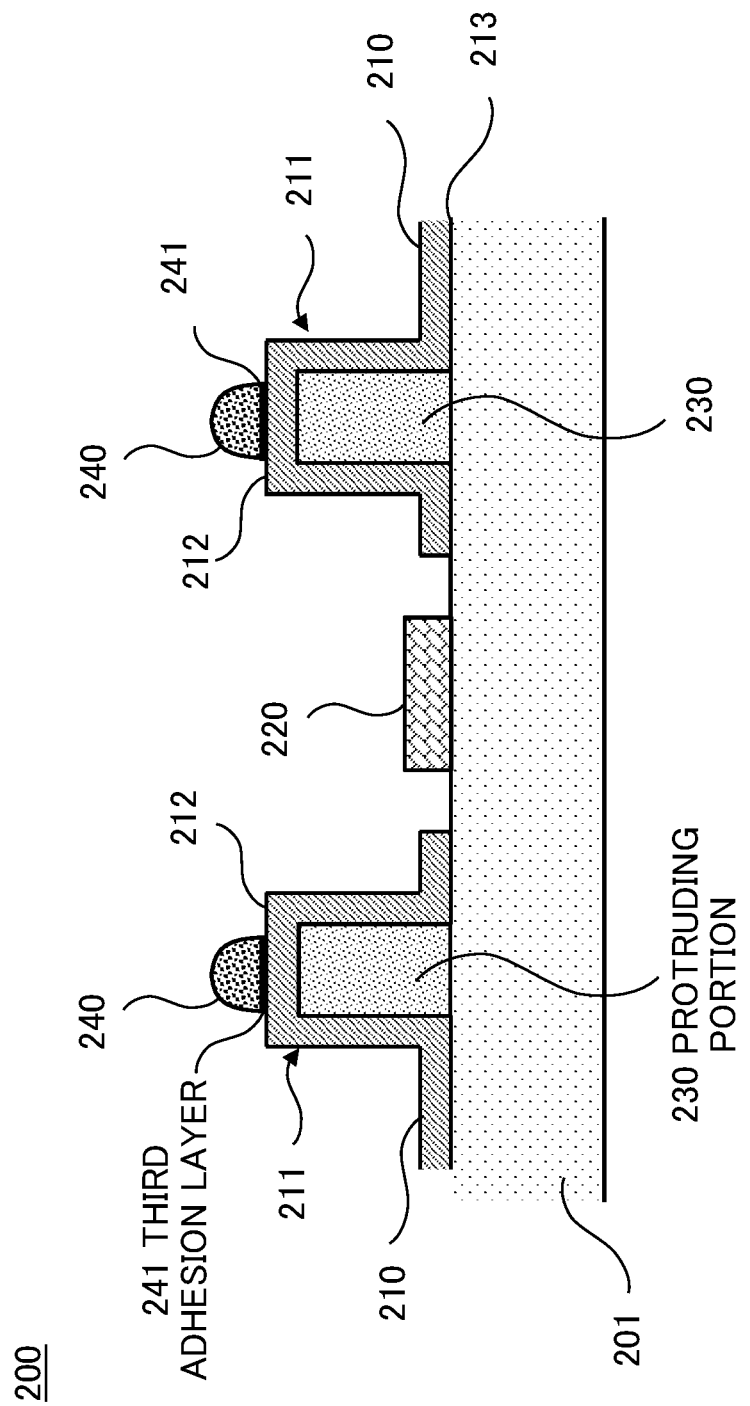
FIG. 13 is a cross-sectional view illustrating a second example of the arrangement of the third superconducting material on the circuit board of the superconducting device of the second example embodiment.

FIG. 13 is a cross-sectional view illustrating the second example of the arrangement of the third superconducting material on the circuit board of the superconducting device according to the second example embodiment. In the second example of FIG. 13, in addition to the configuration of the first example of FIG. 12, a third adhesion layer 241 is provided between the third superconducting material 240 and the upper surface 212. The third adhesion layer 241 can be formed of, for example, titanium, titanium nitride, or iridium. By providing the third adhesion layer 241, adhesion between the third superconducting material 240 and the upper surface 212 can be enhanced.

Next, as a modification of the circuit board 200 used in the superconducting device of the second example embodiment, a third configuration example of the circuit board 200 will be described.

Figure 14:
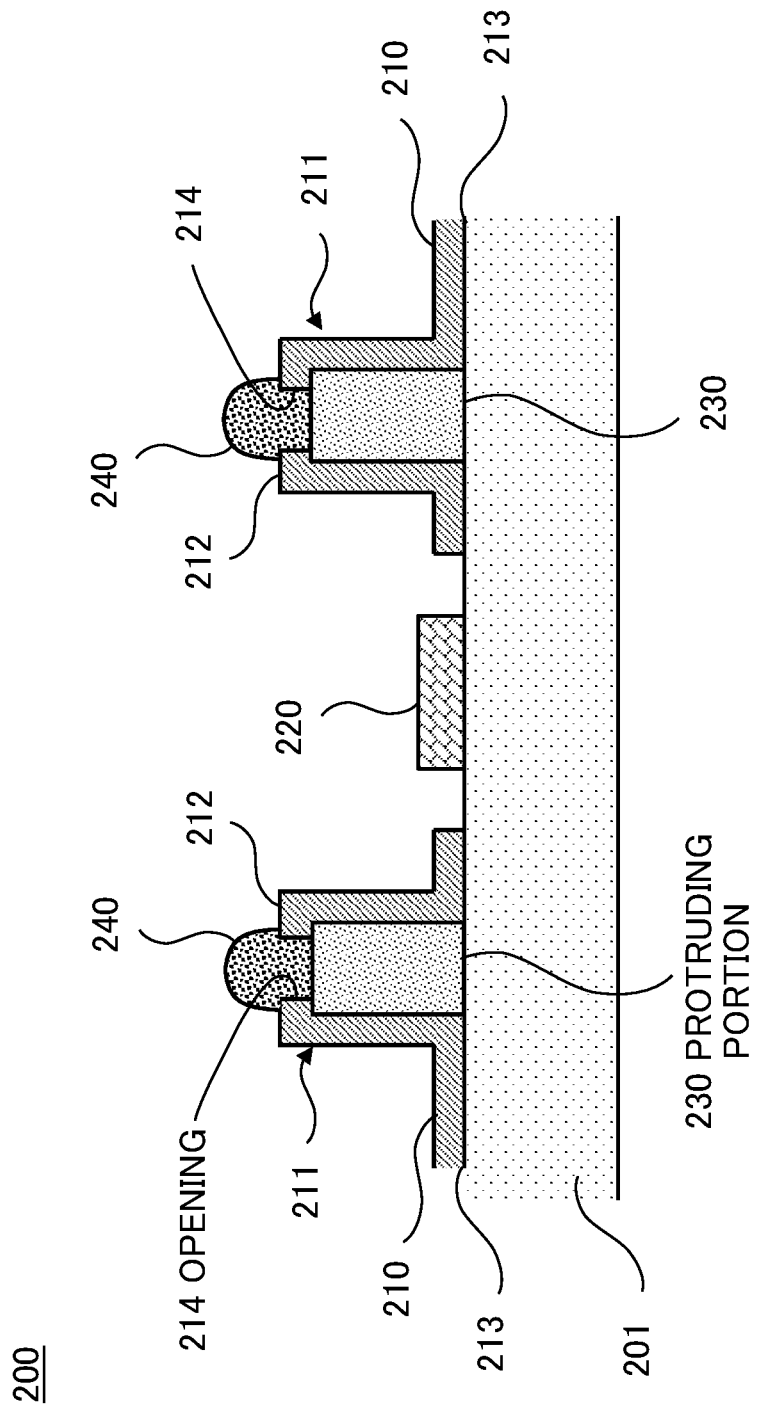
FIG. 14 is a cross-sectional view illustrating a third configuration example of the circuit board used in the superconducting device of the second example embodiment.

FIG. 14 is a cross-sectional view illustrating the third configuration example of the circuit board 200 used in the superconducting device of the second example embodiment. In the example of FIG. 14, an opening 214 in which the thin film 210a of the second superconducting material has the opening 214 inside the upper surface 212 can be formed by, for example, photolithography. For example, when the adhesion between the third superconducting material 240 and the thin film 210a of the second superconducting material is poor and the adhesion between the third superconducting material 240 and the protruding portion 230 is good, the adhesion can be enhanced by providing the opening 214.

Next, as a modification of the circuit board 200 used in the superconducting device of the second example embodiment, a fourth configuration example of the circuit board 200 will be described.

Figure 15:
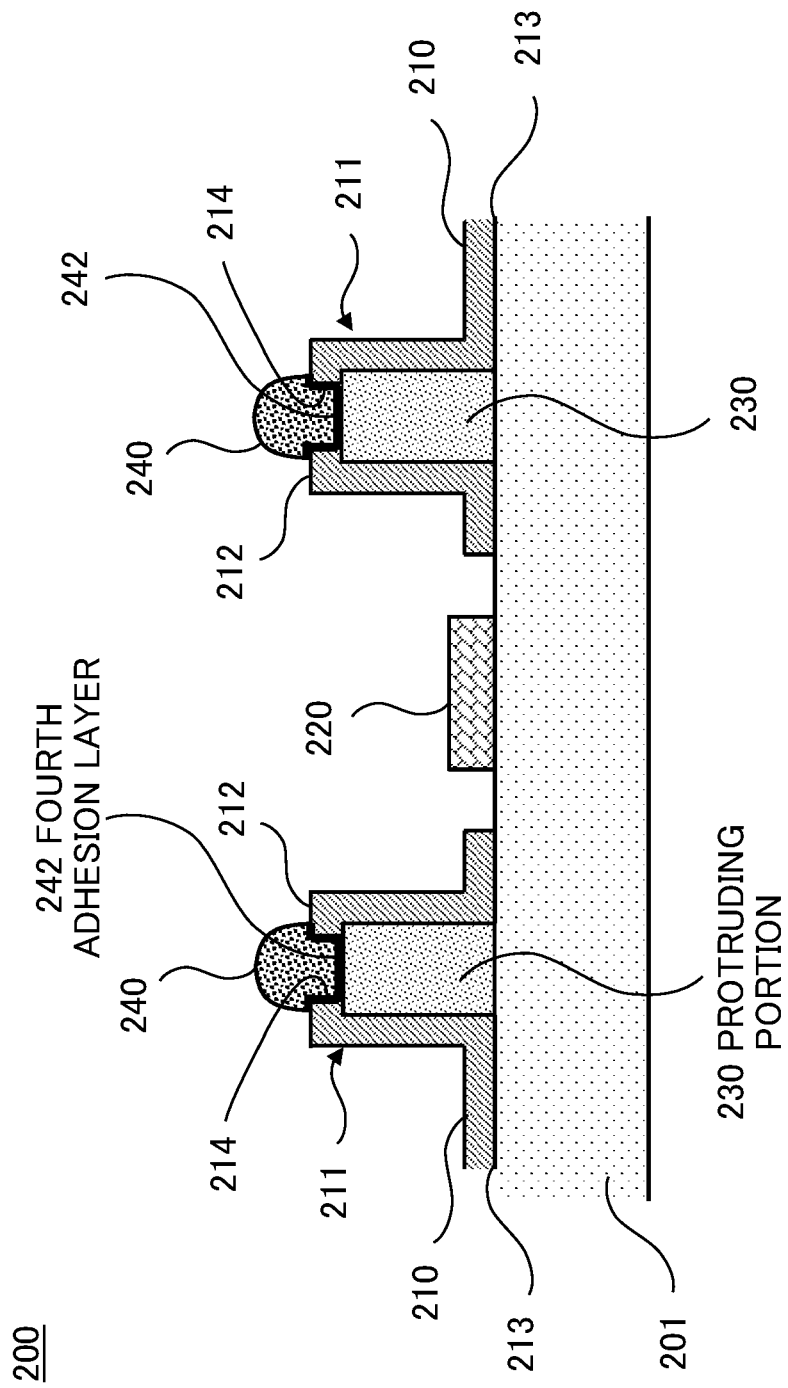
FIG. 15 is a cross-sectional view illustrating a fourth configuration example of the circuit board used in the superconducting device of the second example embodiment.

FIG. 15 is a cross-sectional view illustrating the fourth configuration example of the circuit board used in the superconducting device of the second example embodiment. In the fourth configuration example of FIG. 15, in addition to the third configuration example of FIG. 14, a fourth adhesion layer 242 is provided between the third superconducting material 240 and the protruding portion 230. By providing the fourth adhesion layer 242, adhesion of the third superconducting material 240 to the protrusion 211 can be enhanced. For example, titanium, titanium nitride, or iridium can be used for the fourth adhesion layer 242.

Figure 16:
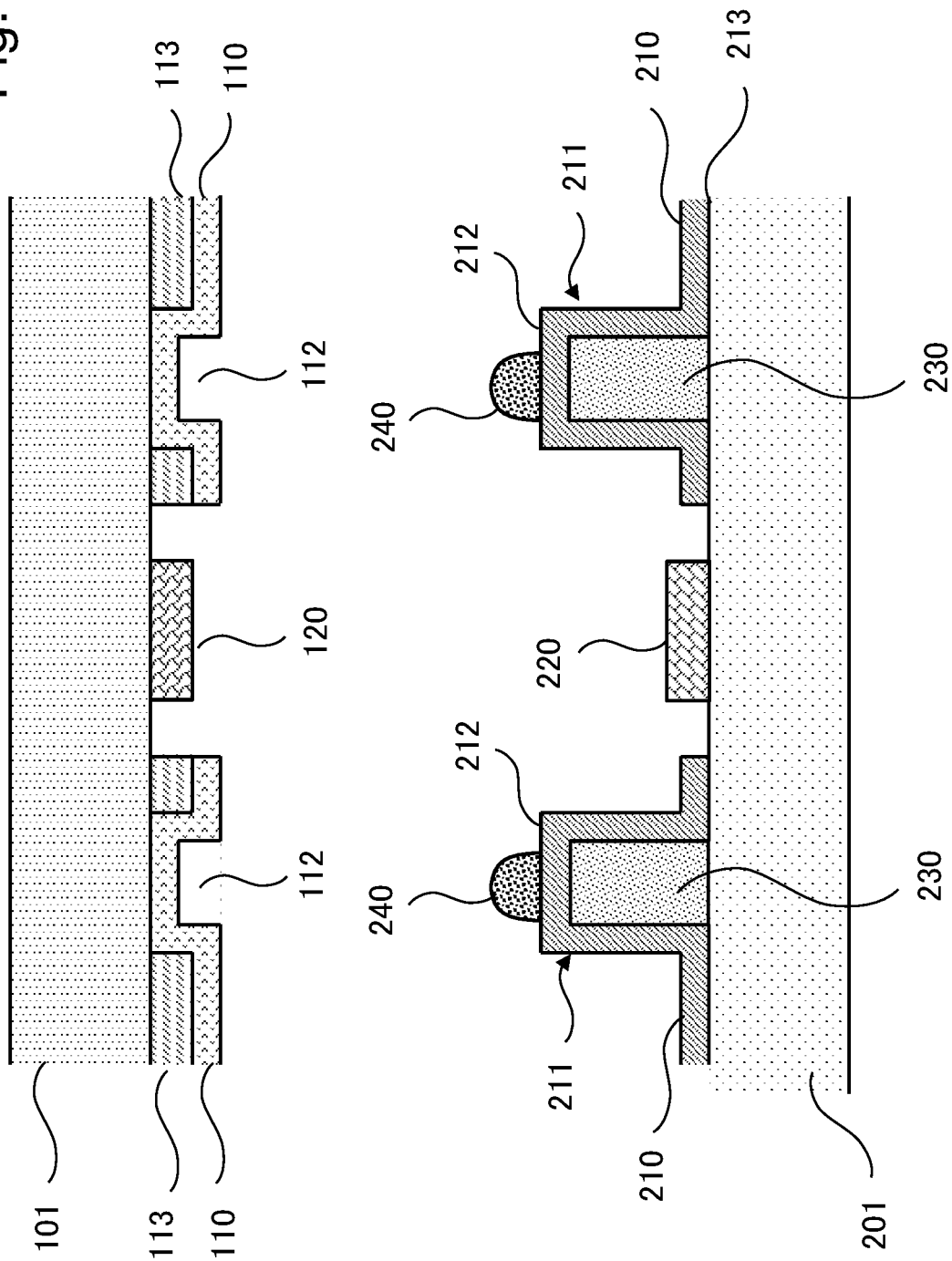
FIG. 16 is a cross-sectional view illustrating a first state in a method for manufacturing the superconducting device of the second example embodiment.
Figure 17:
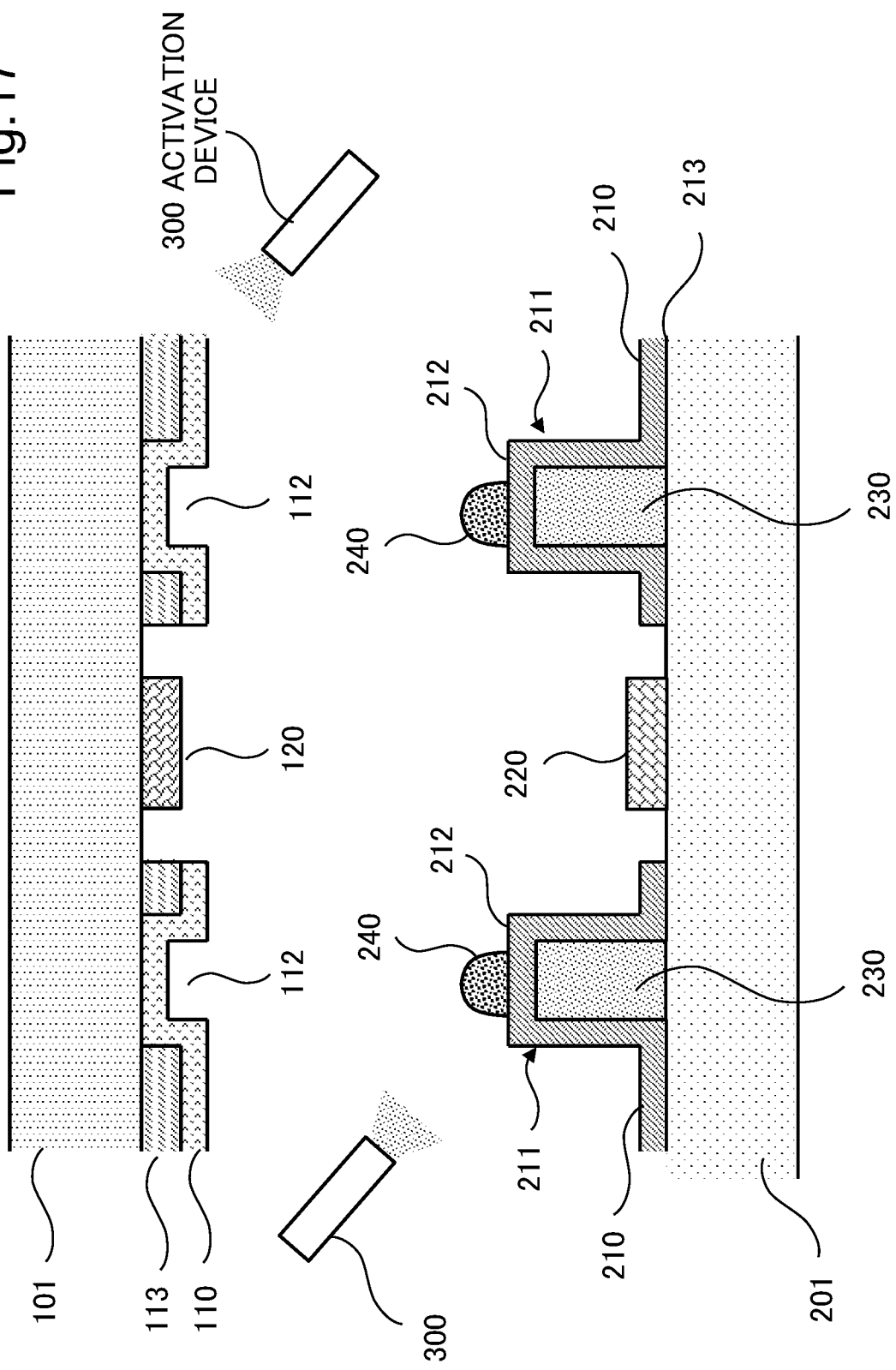
FIG. 17 is a cross-sectional view illustrating a second state in the method for manufacturing the superconducting device of the second example embodiment.
Figure 18:
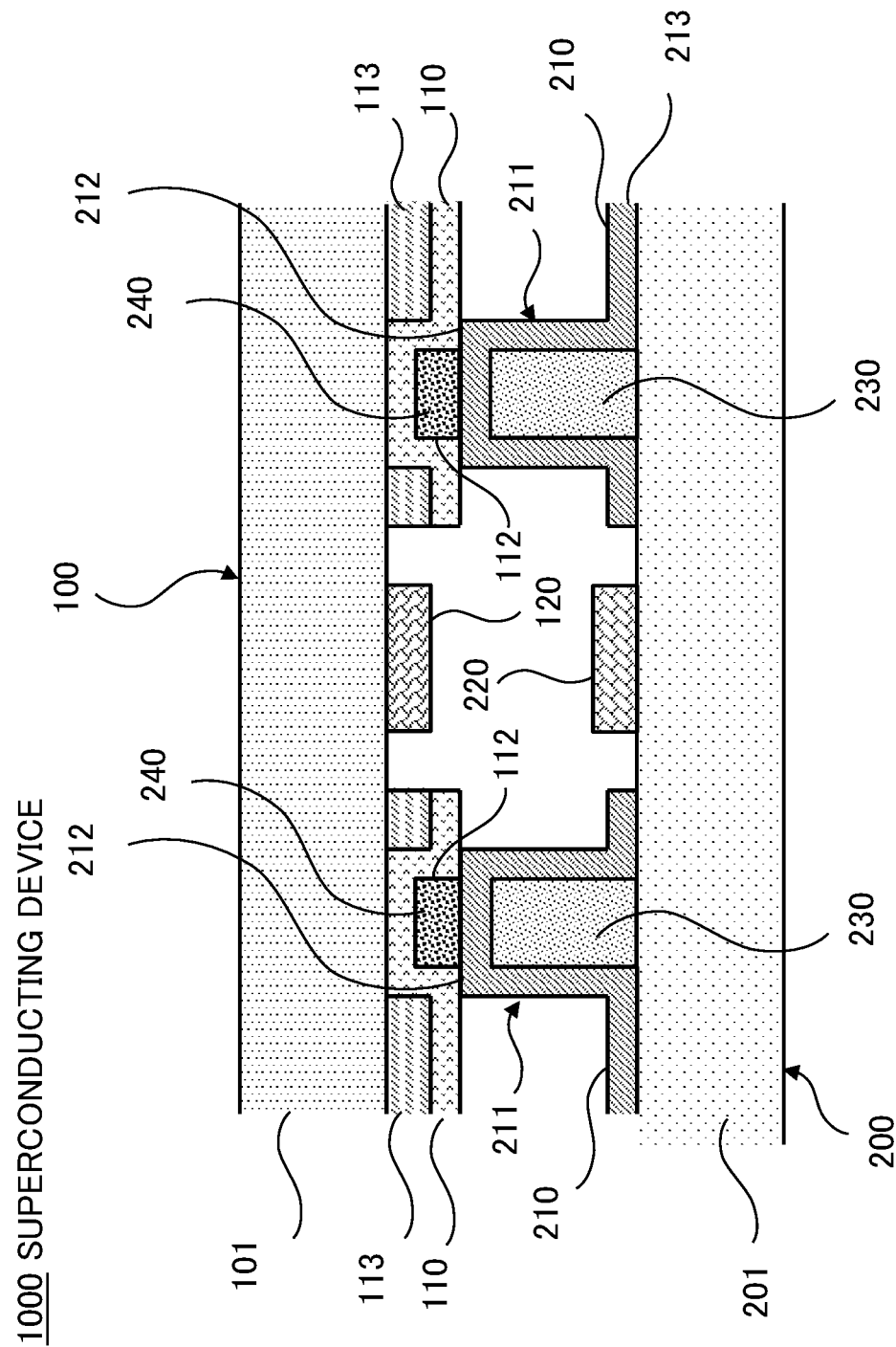
FIG. 18 is a cross-sectional view illustrating a third state in the method for manufacturing the superconducting device of the second example embodiment.

Next, a method for manufacturing a superconducting device according to the second example embodiment will be described. FIG. 16 is a cross-sectional view illustrating a first state in the method for manufacturing the superconducting device of the second example embodiment. FIG. 17 is a cross-sectional view illustrating a second state in the method for manufacturing the superconducting device of the second example embodiment. FIG. 18 is a cross-sectional view illustrating a third state in the method for manufacturing the superconducting device of the second example embodiment.

First, as illustrated in FIG. 16, the superconducting integrated circuit chip 100 and the circuit board 200 are arranged in a vacuum chamber (not illustrated) in a direction in which circuit formation surfaces thereof face each other, and vacuuming is performed. In this case, the superconducting integrated circuit chip 100 is fixed by a chip fixing jig (not illustrated), and the circuit board 200 is also fixed by a board fixing jig (not illustrated). As a fixing method, for example, a clamp method, an electrostatic chuck method, or the like can be applied. A degree of vacuum in the chamber is preferably, for example, about $10^{-6}$ Pa.

Next, as illustrated in FIG. 17, using an activation device 300, adsorbents and oxides on the flat surface 111 of the first electrode 110 and the surface of the first recess 112, which are to be a joint of the superconducting integrated circuit chip 100, are removed to activate the joint. As the activation device 300 that performs activation, for example, a device that emits an ion, a neutral atom beam, or the like can be used. Similarly, using the activation device 300, an adsorbent and an oxide on the surface of the protrusion 211 and the third superconducting material 240, which become the joint of the circuit board 200, are removed to activate the joint.

Next, as illustrated in FIG. 18, the superconducting integrated circuit chip 100 and the circuit board 200 are aligned such that the first non-contact coupling circuit 120 and the second non-contact coupling circuit 220 face each other. In this case, the third superconducting material 240 arranged in a bump shape on the upper surface 212 is positioned so as to face the inside of the first recess 112. Then, in a state where the degree of vacuum is maintained, the superconducting integrated circuit chip 100 and the circuit board 200 are brought close to each other, and the flat surface 111 of the first electrode 110 and the upper surface 212 of the protrusion 211 are brought into contact with each other. The superconducting integrated circuit chip 100 and the circuit board 200 are brought close to each other so that the flat surface 111 of the first electrode 110 and the upper surface 212 of the protrusion 211 are in close contact with each other. A force in a direction in which both the superconducting integrated circuit chip 100 and the circuit board 200 approach each other is applied, and a contact portion between both is pressurized with a predetermined force. In this case, a temperature of the first recess 112 and a temperature of the third superconducting material 240 are controlled to, for example, a range of 25 to 100 degree Celsius, which is a normal temperature. By joining at a low temperature of equal to or lower than 100 degree Celsius, it is possible to reduce a positional deviation at the time of joining due to a state change of the superconducting element due to heating or thermal expansion of the member, and to perform accurately positioned joining.

By the above pressurization, the third superconducting material 240 having spreadability is inserted into the first recess 112 and joined following a surface roughness of the inner surface of the first recess 112. A part of the flat surface 111 of the first electrode 110 and an outer periphery of the upper surface 212 of the protrusion 211 are also joined. In these junctions, the thin film 110a of the first superconducting material and the third superconducting material 240 form an amorphous layer at a junction interface, and both are firmly bonded. Similarly, the thin film 110a of the first superconducting material and the thin film 210a of the second superconducting material also form an amorphous layer at the joining interface, and both are firmly bonded. Although not illustrated, for example, alignment of the superconducting integrated circuit chip 100 and the circuit board 200 can be performed by providing alignment marks on the superconducting integrated circuit chip 100 and the circuit board 200 and adjusting the positions using a transmission image by an infrared camera.

Figure 19:
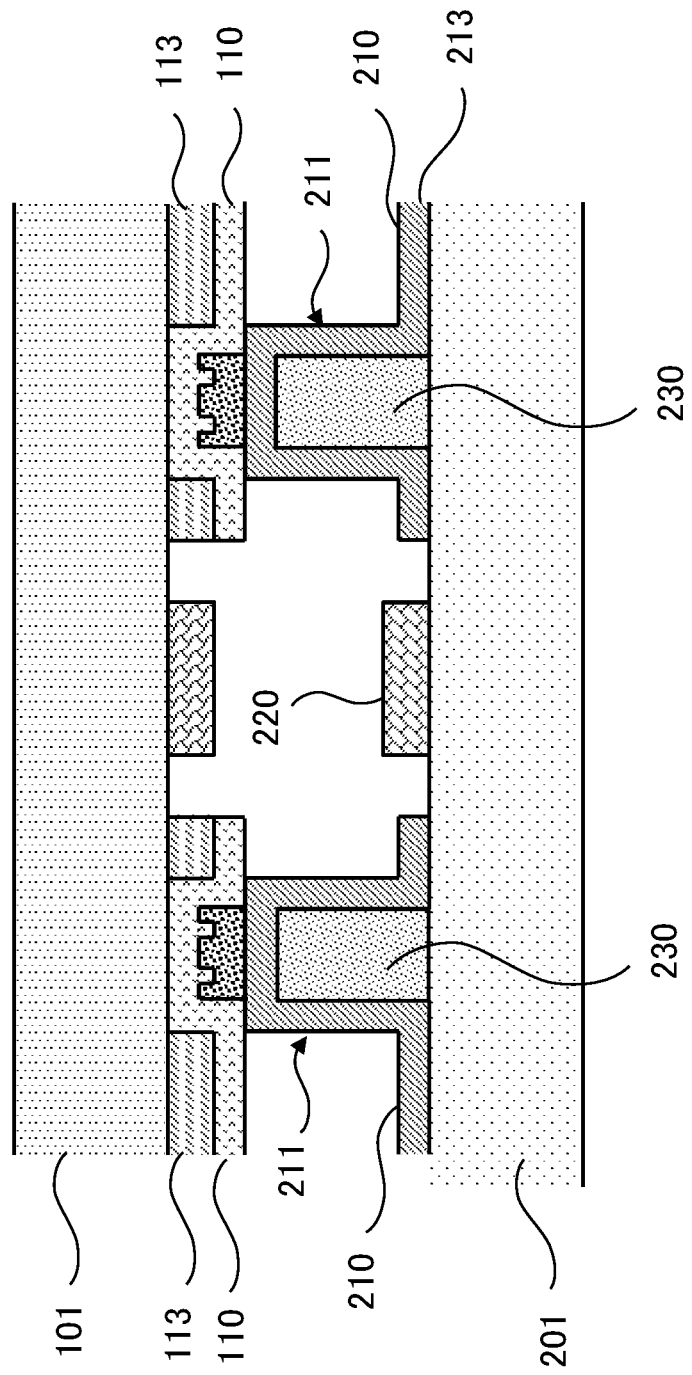
FIG. 19 is a cross-sectional view illustrating a modification of the superconducting device of the second example embodiment.

Next, a modification of the superconducting device 1000 will be described. FIG. 19 is a cross-sectional view illustrating a modification of the superconducting device 1000 described in FIG. 18. In this modification, as the superconducting integrated circuit chip 100, the superconducting integrated circuit chip 100 having the uneven portion 112a at the bottom portion of the first recess 112 illustrated in FIG. 6 is used. By using the superconducting integrated circuit chip 100, the area of contact between the third superconducting material 240 filling the first recess 112 and the first recess 112 increases, and thus, the superconducting integrated circuit chip 100 and the circuit board 200 can be firmly joined.

The superconducting device and the like of the second example embodiment of the present invention have been described above.

The superconducting device 1000 of the second example embodiment includes the superconducting integrated circuit chip 100 and the circuit board 200. The superconducting integrated circuit chip 100 has the first electrode 110 made of the first superconducting material and the first non-contact coupling circuit 120 on the surface thereof. The circuit board 200 has the second electrode 210 made of the second superconducting material and the second non-contact coupling circuit 220 on the surface thereof, and is arranged so as to face the superconducting integrated circuit chip 10. The second electrode 210 includes the flat upper surface 212 and has the protrusion 211 protruding toward the superconducting integrated circuit chip 100. The first electrode 110 includes the flat surface 111 and the first recess 112 arranged inside the flat surface 111 and having an area smaller than that of the upper surface 212. Then, the first recess 112 is arranged to face the upper surface 212 to be located inside the upper surface 212, and the upper surface 212 and the flat surface 111 are in contact with each other, and the third superconducting material 240 connecting the upper surface 212 and the first recess 112 is arranged inside the first recess 112.

In the above configuration, since the upper surface 212 of the protrusion 211 is in contact with the flat surface 111 of the first electrode 110, the distance between the first non-contact coupling circuit 120 and the second non-contact coupling circuit 220 is determined to a predetermined value determined by the height of the protrusion 211. That is, it is possible to provide the superconducting device 1000 capable of more accurately arranging the first non-contact coupling circuit 120 and the second non-contact coupling circuit 220 with respect to the design value. As a result, it is possible to obtain input/output characteristics closer to a design value by non-contact coupling. Since the first electrode 110 and the third superconducting material 240 are joined to each other in the first recess 112, the area of the joint surface increases as compared with the case of joining flat surfaces to each other, and a strong joint can be formed.

According to one aspect, in the superconducting device 1000, the thin film 110a of the first superconducting material is arranged on the surface of the first electrode 110. In this configuration, by arranging the thin film 110a of the first superconducting material having a uniform film thickness, the first recess 112 can be formed along the shape formed by the underlying recess forming layer 113.

According to one aspect, in the superconducting device 1000, at least one first adhesion layer 110b is arranged below the thin film 110a of the first superconducting material. By providing the first adhesion layer 110b, adhesion between the thin film 110a of the first superconducting material and a base such as the base material 101 can be improved.

According to one aspect, in the superconducting device 1000, the second recess 102 is arranged below the first electrode 110 at a position corresponding to the first recess 112. By providing the second recess 102, the first recess 112 can be formed using the thin film 110a of the first superconducting material having a uniform film thickness.

According to one aspect, in the superconducting device 1000, the second recess 102 is provided in the base material 101 of the superconducting integrated circuit chip 100. Providing the second recess 102 in the base material 101 facilitates forming a deeper first recess 112.

According to one aspect, in the superconducting device 1000, the second recess 102 is formed by filling the through hole 103 provided in the base material 101 of the superconducting integrated circuit chip 100 with a first material different from the base material 101 to a predetermined depth. With this configuration, it is easy to form the deeper second recess 102, and it is easy to form the deeper first recess 112 corresponding thereto.

According to one aspect, in the superconducting device 1000, the surface of the second electrode 210 is formed of the thin film 210a of the second superconducting material. By using the thin film 210a of the second superconducting material, the second electrode 210 having excellent characteristics and workability can be obtained.

According to one aspect, in the superconducting device 1000, at least one second adhesion layer 213 is arranged below the thin film 210a of the second superconducting material. By providing the second adhesion layer 213, adhesion between the thin film 210a of the second superconducting material and a base such as the substrate 201 can be improved.

According to one aspect, in the superconducting device 1000, the protruding portion 230 made of a second material different from the second superconducting material is arranged in the thin film 210a of the second superconducting material in the protrusion 211. By forming the protruding portion 230 using a material having good workability different from the second superconducting material, it is easy to form the protruding portion 230 having a desired shape and to form the protrusion 211 having a desired shape.

According to one aspect, in the superconducting device 1000, the thin film 210a of the second superconducting material has the opening 214 inside the upper surface 212, and the third superconducting material 240 is arranged at a position corresponding to the opening 214. With such a configuration, when the adhesion between the third superconducting material 240 and the thin film 210a of the second superconducting material is inferior to the adhesion between the third superconducting material 240 and the material of the protruding portion 230, the adhesion can be improved.

According to one aspect, in the superconducting device 1000, the fourth adhesion layer 242 for enhancing adhesion between the second material and the third superconducting material 240 is formed in the opening 214. By the effect of the fourth adhesion layer 242, adhesion between the third superconducting material 240 and the protruding portion 230 can be improved.

According to one aspect, the third adhesion layer 241 is arranged in the superconducting device 1000. The third adhesion layer 241 enhances adhesion between the third superconducting material 240 and at least a part of the upper surface 212. In this configuration, the adhesion between the third superconducting material 240 and the upper surface 212 can be improved by the effect of the third adhesion layer 241.

According to one aspect, in the superconducting device 1000, at least a part of a portion where the flat surface 111 and the upper surface 212 are in contact with each other has the first joint where the flat surface 111 and the upper surface 212 are directly joined to each other. By joining the flat surface 111 and the upper surface 212, the superconducting integrated circuit chip 100 and the circuit board can be more firmly bonded.

According to one aspect, in the superconducting device 1000, the first joint has an amorphous layer including a first superconducting material and a second superconducting material. By forming the amorphous layer, the thin film 110a of the first superconducting material and the thin film 210a of the second superconducting material can be more firmly bonded.

According to one aspect, the superconducting device 1000 has the second joint in which the thin film 110a of the first superconducting material located in the first recess 112 and the third superconducting material 240 are directly joined. In this configuration, since the thin film 110a of the first superconducting material and the third superconducting material 240 in the first recess 112 are joined, the joining becomes stronger.

According to one aspect, in the superconducting device 1000, the second joint has the amorphous layer including the first superconducting material and the third superconducting material 240. According to this configuration, the thin film 110a of the first superconducting material and the third superconducting material 240 can be joined more firmly.

According to one aspect, in the superconducting device 1000, the uneven portion 112a is formed on the bottom surface of the first recess 112. The uneven portion 112a increases the contact area between the thin film 110a of the first superconducting material and the third superconducting material 240, and thus, the joining can be further strengthened.

According to one aspect, in the superconducting device 1000, the third superconducting material 240 is a material having higher spreadability than the first superconducting material. With this configuration, it is possible to perform joining with high strength even when the first recess 112 is miniaturized.

In the method for manufacturing the superconducting device 1000 of the second example embodiment, the superconducting integrated circuit chip 100 and the circuit board 200 are joined. The superconducting integrated circuit chip 100 has the first electrode 110 made of the first superconducting material and the first non-contact coupling circuit 120 on the surface thereof. The circuit board 200 has the second electrode 210 made of the second superconducting material and the second non-contact coupling circuit 220 on the surface thereof, and is arranged so as to face the superconducting integrated circuit chip 100. Here, the second electrode 210 includes the flat upper surface 212 and has the protrusion 211 protruding toward the superconducting integrated circuit chip 100. The first electrode 110 includes the flat surface 111 and the first recess 112 that is arranged inside the flat surface 111 and has an area smaller than that of the upper surface 212. In the method for manufacturing the superconducting device 1000 according to the second example embodiment, the third superconducting material 240 connecting the upper surface 212 and the first recess 112 is arranged inside the first recess 112. The first recesses 112 are arranged opposite to each other so as to be located inside the upper surface 212, and the upper surface 212 and the flat surface 111 are brought into contact with each other.

According to another aspect, in the method for manufacturing the superconducting device 1000, the superconducting integrated circuit chip 100 and the circuit board 200 are joined in a vacuum chamber. With this configuration, the flat surface 111 and the upper surface 212 can be joined, and the first recess 112 and the third superconducting material 240 can be joined.

According to one aspect, in the method for manufacturing the superconducting device 1000, before the flat surface 111 and the upper surface 212 are brought into contact with each other, the surface of the first recess 112 and the surface of the third superconducting material 240 are activated to bring the flat surface 111 and the upper surface 212 into contact with each other. With this configuration, the joining between the flat surface 111 and the upper surface 212 and the joining between the first recess 112 and the third superconducting material 240 can be further strengthened.

According to one aspect, in the method for manufacturing the superconducting device 1000, the temperature of the first recess 112 and the temperature of the third superconducting material 240 are controlled to fall within the range of 25 to 100 degree Celsius, which is the normal temperature, and the flat surface and the upper surface are brought into contact with each other. When the joining is performed at a low temperature of equal to or lower than 100 degree Celsius, a positional deviation at the time of joining due to a change in the state of the superconducting element due to heating or thermal expansion of the member is small, and accurately positioned joining can be performed.

According to one aspect, in the method for manufacturing the superconducting device 1000, the arithmetic average roughness of the flat surface 111 and the arithmetic average roughness of the upper surface 212 are set to equal to or less than 1 nm. With this configuration, the flat surface 111 and the upper surface 212 can be more firmly joined.

The whole or part of the example embodiments disclosed above can be described as, but not limited to, the following supplementary notes.

(Supplementary Note 1)

A superconducting device including:
- a superconducting integrated circuit chip having a first electrode made of a first superconducting material and a first non-contact coupling circuit on a surface thereof; and
- a circuit board having a second electrode made of a second superconducting material and a second non-contact coupling circuit on a surface thereof, the circuit board being arranged in such a way to face the first non-contact coupling circuit,
- wherein the second electrode has a protrusion having a flat upper surface and protruding toward the superconducting integrated circuit chip,
- the first electrode includes a flat surface and a first recess arranged inside the flat surface and having an area smaller than an area of the upper surface,
- the first recess is arranged to face the upper surface in such a way to be located inside the upper surface,
- the upper surface and the flat surface are in contact with each other, and
- a third superconducting material connecting the upper surface and the first recess is arranged inside the first recess.

(Supplementary Note 2)

The superconducting device according to Supplementary Note 1,
wherein a thin film of the first superconducting material is arranged on a surface of the first electrode.

(Supplementary Note 3)

The superconducting device according to Supplementary Note 2,
wherein at least one first adhesion layer is arranged below the thin film of the first superconducting material.

(Supplementary Note 4)

The superconducting device according to Supplementary Note 2 or 3,
wherein a second recess is arranged below the first electrode at a position corresponding to the first recess.

(Supplementary Note 5)

The superconducting device according to Supplementary Note 4,
wherein the second recess is provided in a base material of the superconducting integrated circuit chip.

(Supplementary Note 6)

The superconducting device according to Supplementary Note 4,
wherein the second recess is formed by filling a through hole provided in the base material of the superconducting integrated circuit chip with a first material different from the base material to a predetermined depth.

(Supplementary Note 7)

The superconducting device according to any one of Supplementary Notes 1 to 6,
wherein a surface of the second electrode is formed of a thin film of the second superconducting material.

(Supplementary Note 8)

The superconducting device according to Supplementary Note 7,
wherein at least one second adhesion layer is arranged below the thin film of the second superconducting material.

The superconducting device according to Supplementary Note 6 or 7, wherein a protruding portion made of a second material different from the second superconducting material is arranged inside a thin film of the second superconducting material in the protrusion.

(Supplementary Note 9)

The superconducting device according to Supplementary Note 8,
wherein the thin film of the second superconducting material has an opening inside the upper surface, and the third superconducting material is arranged at a position corresponding to the opening.

(Supplementary Note 10)

The superconducting device according to Supplementary Note 9,
wherein a third adhesion layer for enhancing adhesion between the second material and the third superconducting material is formed in the opening.

(Supplementary Note 11)

The superconducting device according to any one of Supplementary Notes 1 to 10,
wherein a fourth adhesion layer for enhancing adhesion between the third superconducting material and the upper surface is arranged between the third superconducting material and at least a part of the upper surface.

(Supplementary Note 12)

The superconducting device according to any one of Supplementary Note 1 to 11,
wherein a first joint for directly joining the flat surface and the upper surface is provided in at least a part of a portion where the flat surface and the upper surface are in contact with each other.

(Supplementary Note 13)

The superconducting device according to Supplementary Note 12,
wherein the first joint includes an amorphous layer including the first superconducting material and the second superconducting material.

(Supplementary Note 14)

The superconducting device according to any one of Supplementary Notes 1 to 13, further including a second joint for directly joining the first superconducting material and the third superconducting material located in the first recess.

(Supplementary Note 15)

The superconducting device according to Supplementary Note 14,
wherein the second joint has an amorphous layer including the first superconducting material and the third superconducting material.

(Supplementary Note 16)

The superconducting device according to any one of Supplementary Notes 1 to 15,
wherein an uneven portion is formed on a bottom surface of the first recess.

(Supplementary Note 17)

The superconducting device according to any one of Supplementary Notes 1 to 16,
wherein the third superconducting material is a material having higher spreadability than the first superconducting material.

(Supplementary Note 18)

A method for manufacturing a superconducting device including a superconducting integrated circuit chip having a first electrode made of a first superconducting material and a first non-contact coupling circuit on a surface thereof, and a circuit board having a second electrode made of a second superconducting material and a second non-contact coupling circuit on a surface thereof, the circuit board being arranged in such a way to face the first non-contact coupling circuit, the second electrode having a protrusion having a flat upper surface and protruding toward the superconducting integrated circuit chip, the first electrode including a flat surface and a first recess arranged inside the flat surface and having an area smaller than an area of the upper surface, the method including:
arranging a third superconducting material connecting the upper surface and the first recess inside the first recess;
arranging the first recess in such a way that the first recess faces the upper surface to be located inside the upper surface; and
bringing the upper surface and the flat surface into contact with each other.

(Supplementary Note 19)

The method for manufacturing a superconducting device according to Supplementary Note 18, further including joining the superconducting integrated circuit chip and the circuit board in a vacuum chamber.

(Supplementary Note 20)

The method for manufacturing a superconducting device according to Supplementary Note 19, further including:
activating a surface of the first recess and a surface of the third superconducting material before bringing the flat surface and the upper surface into contact with each other; and
bringing the flat surface and the upper surface into contact with each other.

(Supplementary Note 21)

The method for manufacturing a superconducting device according to Supplementary Note 20, further including controlling a temperature of the first recess and a temperature of the third superconducting material to fall within a range of 25 to 100 degree Celsius to bring the flat surface and the upper surface into contact with each other.

(Supplementary Note 22)

The method for manufacturing a superconducting device according to any one of Supplementary Notes 17 to 21,
wherein an arithmetic average roughness of the flat surface and an arithmetic average roughness of the upper surface are set to equal to or less than 1 nm.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A superconducting device comprising:
a superconducting integrated circuit chip having a first electrode made of a first superconducting material and a first non-contact coupling circuit on a surface thereof; and
a circuit board having a second electrode made of a second superconducting material and a second non-contact coupling circuit on a surface thereof, the circuit board being arranged in such a way to face the superconducting integrated circuit chip, wherein the second electrode has a protrusion having a flat upper surface and protruding toward the superconducting integrated circuit chip, the first electrode includes a flat surface and a first recess arranged inside the flat surface and having an area smaller than an area of the upper surface, the first recess is arranged to face the upper surface in such a way to be located inside the upper surface, the upper surface and the flat surface are in contact with each other, and a third superconducting material connecting the upper surface and the first recess is arranged inside the first recess.

2. The superconducting device according to claim 1, wherein a thin film of the first superconducting material is arranged on a surface of the first electrode.

3. The superconducting device according to claim 2, wherein a second recess is arranged below the first electrode at a position corresponding to the first recess.

4. The superconducting device according to claim 3, wherein the second recess is provided in a base material of the superconducting integrated circuit chip.

5. The superconducting device according to claim 4, wherein a protruding portion made of a second material different from the second superconducting material is arranged inside a thin film of the second superconducting material in the protrusion.

6. The superconducting device according to claim 5, wherein the thin film of the second superconducting material has an opening inside the upper surface, and the third superconducting material is arranged at a position corresponding to the opening.

7. The superconducting device according to claim 3, wherein a protruding portion made of a second material different from the second superconducting material is arranged inside a thin film of the second superconducting material in the protrusion.

8. The superconducting device according to claim 7, wherein the thin film of the second superconducting material has an opening inside the upper surface, and the third superconducting material is arranged at a position corresponding to the opening.

9. The superconducting device according to claim 2, wherein a protruding portion made of a second material different from the second superconducting material is arranged inside a thin film of the second superconducting material in the protrusion.

10. The superconducting device according to claim 9, wherein the thin film of the second superconducting material has an opening inside the upper surface, and the third superconducting material is arranged at a position corresponding to the opening.

11. The superconducting device according to claim 1, wherein a second recess is arranged below the first electrode at a position corresponding to the first recess.

12. The superconducting device according to claim 11, wherein the second recess is provided in a base material of the superconducting integrated circuit chip.

13. The superconducting device according to claim 11, wherein a protruding portion made of a second material different from the second superconducting material is arranged inside a thin film of the second superconducting material in the protrusion.

14. The superconducting device according to claim 13, wherein the thin film of the second superconducting material has an opening inside the upper surface, and the third superconducting material is arranged at a position corresponding to the opening.

15. The superconducting device according to claim 1, wherein a protruding portion made of a second material different from the second superconducting material is arranged inside a thin film of the second superconducting material in the protrusion.

16. The superconducting device according to claim 15, wherein the thin film of the second superconducting material has an opening inside the upper surface, and the third superconducting material is arranged at a position corresponding to the opening.

17. The superconducting device according to claim 1, wherein an adhesion layer for enhancing adhesion between the third superconducting material and the upper surface is arranged between the third superconducting material and at least a part of the upper surface.

18. The superconducting device according to claim 1, further comprising a second joint for directly joining the first superconducting material and the third superconducting material located in the first recess.

19. The superconducting device according to claim 1, wherein the third superconducting material is a material having higher spreadability than the first superconducting material.

20. A method for manufacturing a superconducting device including a superconducting integrated circuit chip having a first electrode made of a first superconducting material and a first non-contact coupling circuit on a surface thereof, and a circuit board having a second electrode made of a second superconducting material and a second non-contact coupling circuit on a surface thereof, the circuit board being arranged in such a way to face the superconducting integrated circuit chip, the second electrode having a protrusion having a flat upper surface and protruding toward the superconducting integrated circuit chip, the first electrode including a flat surface and a first recess arranged inside the flat surface and having an area smaller than an area of the upper surface, the method comprising:

arranging a third superconducting material connecting the upper surface and the first recess inside the first recess;

arranging the first recess in such a way that the first recess faces the upper surface to be located inside the upper surface; and bringing the upper surface and the flat surface into contact with each other.

* * * * *